United States Patent
Augusto

(10) Patent No.: US 8,963,169 B2
(45) Date of Patent: Feb. 24, 2015

(54) CMOS PIXELS COMPRISING EPITAXIAL LAYERS FOR LIGHT-SENSING AND LIGHT EMISSION

(75) Inventor: Carlos J. R. P. Augusto, San Jose, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 695 days.

(21) Appl. No.: 11/572,519

(22) PCT Filed: Jul. 28, 2005

(86) PCT No.: PCT/EP2005/008213
§ 371 (c)(1),
(2), (4) Date: Jan. 23, 2007

(87) PCT Pub. No.: WO2006/010618
PCT Pub. Date: Feb. 2, 2006

(65) Prior Publication Data
US 2008/0001139 A1    Jan. 3, 2008

Related U.S. Application Data

(60) Provisional application No. 60/591,658, filed on Jul. 28, 2004.

(51) Int. Cl.
*H01L 27/15* (2006.01)
*H01L 29/18* (2006.01)
(Continued)

(52) U.S. Cl.
CPC .......... *H01L 27/15* (2013.01); *H01L 27/14603* (2013.01); *H01L 27/14643* (2013.01);
(Continued)

(58) Field of Classification Search
CPC . H01L 31/028; H01L 33/002; H01L 33/0004; H01L 31/022408; H01L 31/02002; H01L 31/02005; H01L 33/14; H01L 33/145; H01L 31/1075; H01L 31/107; H01L 31/02027; H01L 27/142; H01L 27/15; H01L 27/14603; H01L 27/14643

USPC .......... 257/438, E31.063, 225–234, 292, 462, 257/13, 199, 603, E31.116, E29.18, 257/E29.335, E21.335, E21.357, 183–186, 257/21, 12, 67–97, E33.049, E33.05, 257/E33.053, E31.032, E31.037–E31.039, 257/E31.095, E31.096; 977/936, 949, 950, 977/952

See application file for complete search history.

(56) References Cited

U.S. PATENT DOCUMENTS 4,202,000 A  *  5/1980  Carballes ........................ 257/85
5,084,747 A       1/1992  Miyawaki
(Continued)

FOREIGN PATENT DOCUMENTS

WO      WO9704493        2/1997
WO      WO 0233755 A2 *  4/2002
(Continued)

OTHER PUBLICATIONS

Linten D et al: "Design-driven Optimisation of a 90 nm RF CMOS Process by use of Elevated Source/Drain" European Solid-State Device Research, 2003 33rd Conference on ESSDERC '03 Sep. 16-18, 2003, Piscataway, NJ, USA, IEEE, Sep. 16, 2003, pp. 43-46, XP010676625 ISBN: 0-7803-7999-4.
(Continued)

*Primary Examiner* — Phat X Cao
*Assistant Examiner* — Diana C Vieira
(74) *Attorney, Agent, or Firm* — Sturm & Fix LLP

(57) ABSTRACT

Photonic devices monolithically integrated with CMOS are disclosed, including sub-100 nm CMOS, with active layers comprising acceleration regions, light emission and absorption layers, and optional energy filtering regions. Light emission or absorption is controlled by an applied voltage to deposited films on a pre-defined CMOS active area of a substrate, such as bulk Si, bulk Ge, Thick-Film SOI, Thin-Film SOI, Thin-Film GOI.

10 Claims, 15 Drawing Sheets

(51) Int. Cl.
*H01L 31/12* (2006.01)
*H01L 33/00* (2010.01)
*H01L 29/66* (2006.01)
*H01L 31/107* (2006.01)
*H01L 27/146* (2006.01)
*H01L 27/142* (2014.01)
*H01L 31/02* (2006.01)

(52) U.S. Cl.
CPC ......... *H01L27/142* (2013.01); *H01L 31/02027* (2013.01); *H01L 31/107* (2013.01); *H01L 31/1075* (2013.01)
USPC ............ 257/87; 257/199; 257/186; 257/438; 257/E31.037

(56) References Cited

U.S. PATENT DOCUMENTS

| | | | |
|---|---|---|---|
| 5,631,664 A * | 5/1997 | Adachi et al. | 345/74.1 |
| 5,686,734 A | 11/1997 | Hamakawa | |
| 5,937,274 A * | 8/1999 | Kondow et al. | 438/47 |
| 6,380,572 B1 * | 4/2002 | Pain et al. | 257/292 |
| 6,525,347 B2 | 2/2003 | Matsuda | 257/184 |
| 6,642,076 B1 * | 11/2003 | Yaung et al. | 438/48 |
| 6,847,045 B2 | 1/2005 | Ossipov et al. | 257/10 |
| 6,909,083 B2 * | 6/2005 | Matsuda | 250/214.1 |
| 6,936,806 B1 * | 8/2005 | Kitamura et al. | 250/208.1 |
| 2002/0017612 A1 | 2/2002 | Yu | |
| 2003/0132467 A1 | 7/2003 | Kim | |
| 2004/0097021 A1 | 5/2004 | Augusto | |
| 2005/0040445 A1 * | 2/2005 | Mouli | 257/290 |
| 2005/0205930 A1 * | 9/2005 | Williams, Jr. | 257/347 |

FOREIGN PATENT DOCUMENTS

| | | |
|---|---|---|
| WO | WO03067663 | 8/2003 |
| WO | WO2004027879 | 1/2004 |

OTHER PUBLICATIONS

Kehrer D et al: "A 60-Gb/s 0.7-V 10 mW monolithic transformer-coupled 2:1 multiplexer in 90 nm CMOS" IEEE Compound Semiconductor Integrated Circuit Symposium. 2004 IEEE CISC Symposium Oct. 24-27, 2004 Monterey, CA, USA, Oct. 24, 2004-Oct. 27, 2004—pp. 105-108, XP002354972 IEEE Compound Semiconductor Integrated Circuit Symposium. 2004 IEEE CISC Symposium. (IEEE Cat. No. 04CH37591) IEEE Piscataway, NJ, USA ISBN: 0-7803-8616-7.

Choi H K et al: "Monolithic Integration of GAAS/ALGAAS LED and SI Driver Circuit" IEEE Electron Device Letters, IEEE Service Center, New York, NY, US—vol. 9, No. 10, Oct. 1, 1988, pp. 512-514, XP000005119 ISSN: 0741-3106.

Yang J Y et al: "Monolithic Integration of GaAs LED array/Si CMOS logic" Gallium Arsenide Integrated Circuit (GAAS IC) Symposium, 1991. Technical Digest 1991., 13th Annual Monterey, CA., USA Oct. 20-23, 1991, New York, NY, USA, IEEE, US, Oct. 20, 1991, pp. 301-304 XP010053228 ISBN: 0-7803-0196-X.

Metzner H et al: "Epitaxial CuIn (1-x)GaxS2 on Si(III): A perfectly lattice-matched system for x≈0.5" Applied Physics Letters, AIP, American Institute of Physics, Melville, NY, US, vol. 83, No. 8, Aug. 25, 2003, pp. 1563-1565, XP012035877 ISSN: 0003-6951.

Tolle John et al: "Growth of SiCAlN on Si(111) via a crystalline oxide interface" Applied Physics Letters, AIP, American Institute of Physics, Melville, NY, US, vol. 81, No. 12, Sep. 16, 2002, pp. 2181-2183, XP012031945 ISSN; 0003-6951.

Corbin E et al: "Structure and doping optimization of SiGe heterojunction internal photoemission detectors for mid-infrared applications" Dec. 2001, Optical Engineering SPIE USA, vol. 40, NR. 12, pp. 2753-2762, XP002354686 ISSN: 0091-3286.

Fiory A T et al: Light emission from silicon: some perspectives and applications: 3rd Sumposium on Materials and Processes for Submicron Technologies Mar. 3, 2003, San Diego, CA, USA, vol. 32, No. 10, Oct. 2003, pp. 1043-1051, XP008056006 Journal of Electronic Materials TMS; IEEE USA ISSN: 0361-5235.

* cited by examiner 121 110 120 160    162 109

121 110 120 160 164 162 109

150 110 120 119 166 163    161 109

150 110 120 119 166 163 165 161 109

121 110 120 160    162 109

121 110 120 160 164 162 109

150 110 120 119 166 163    161 109

150 110 120 119 166 163 165 161 109

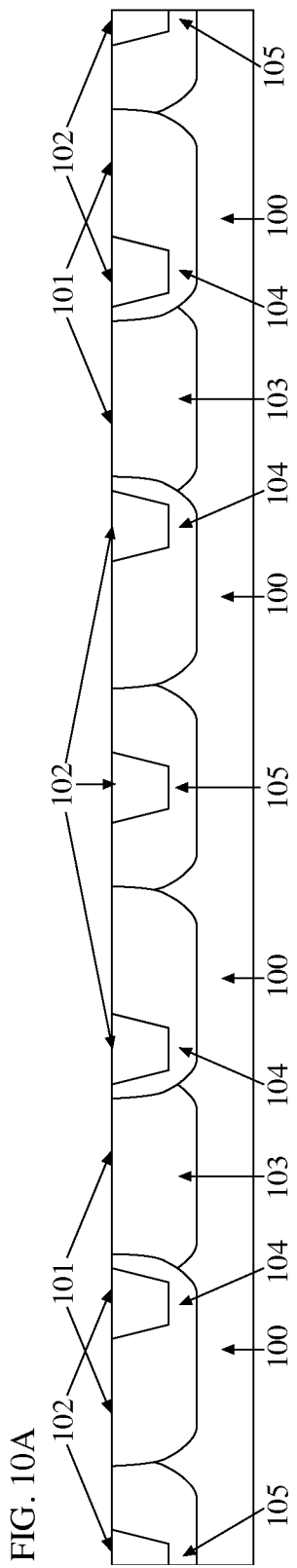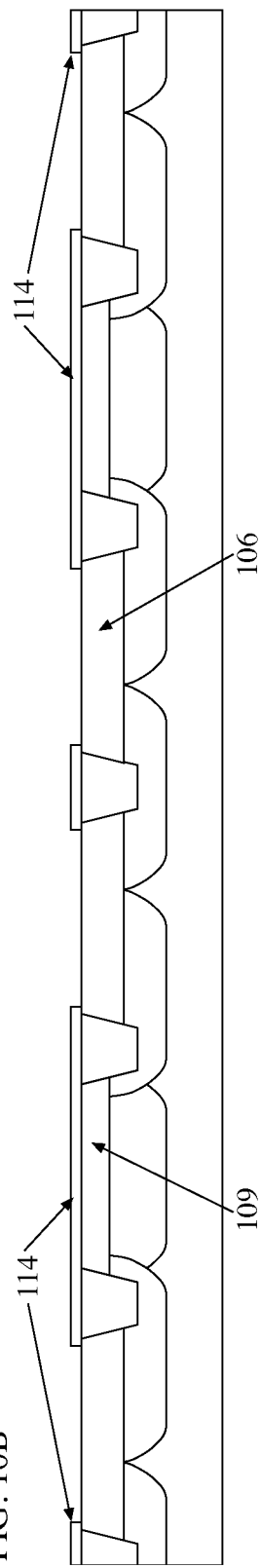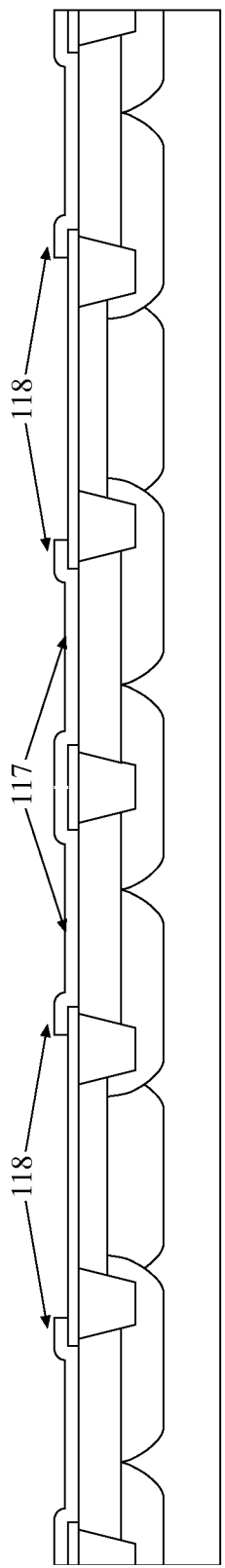

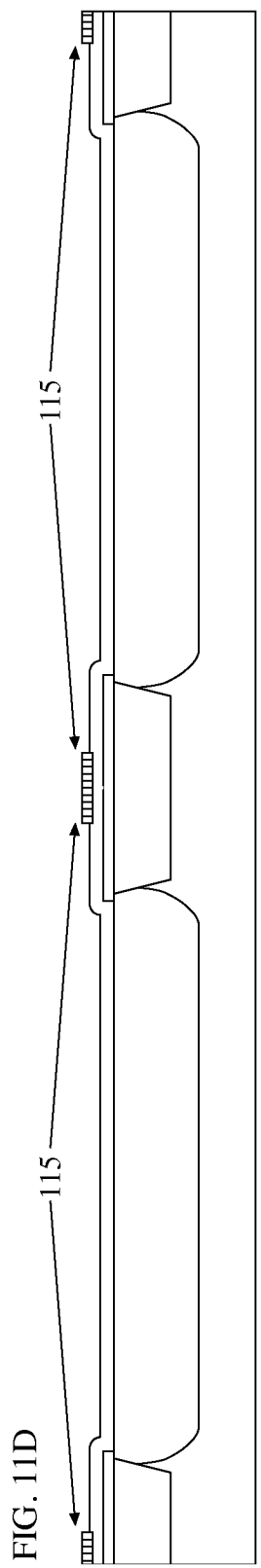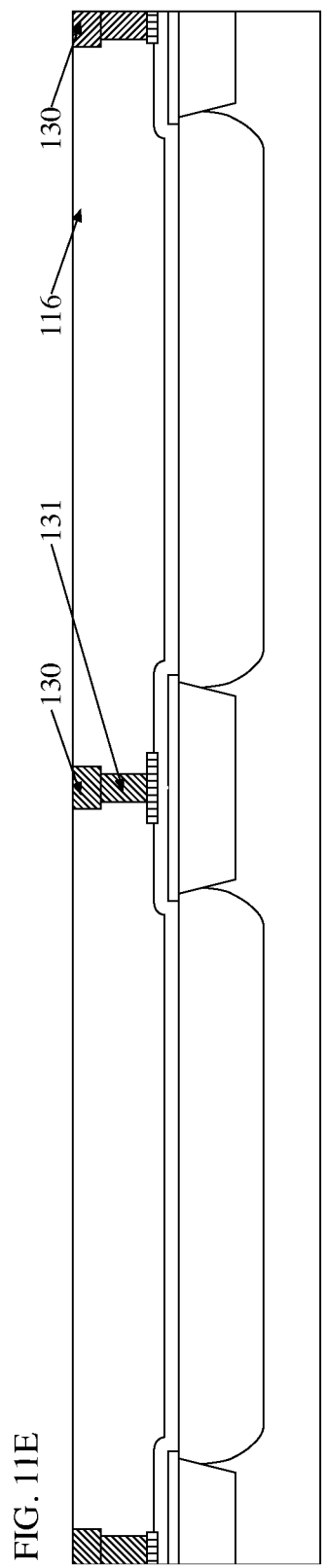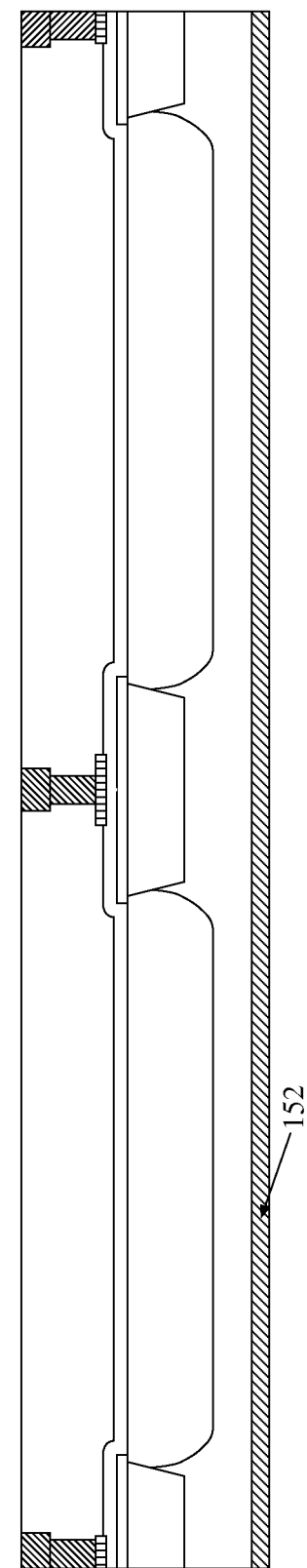

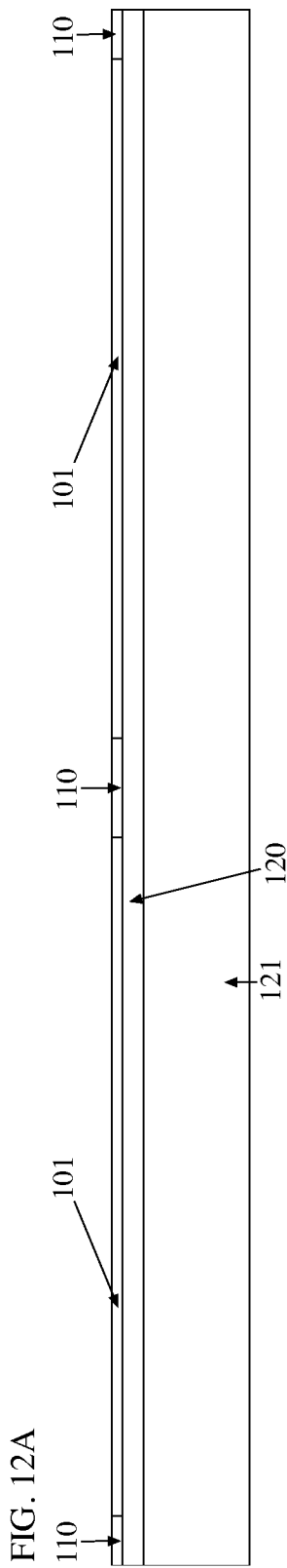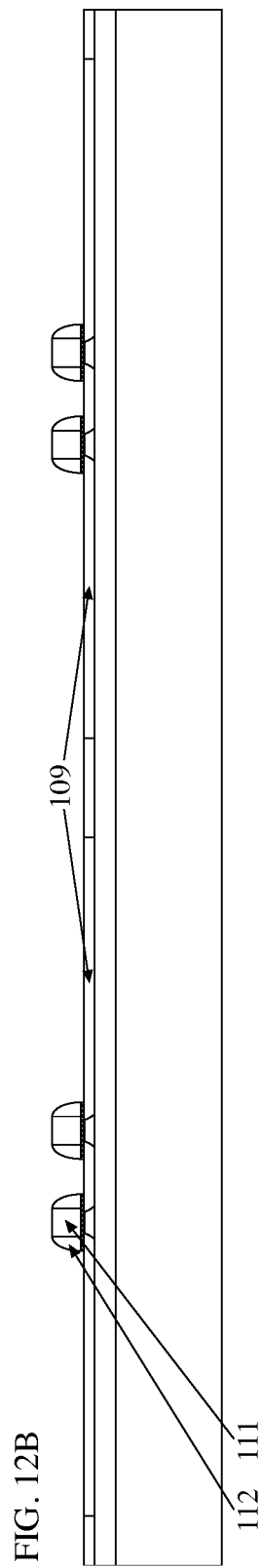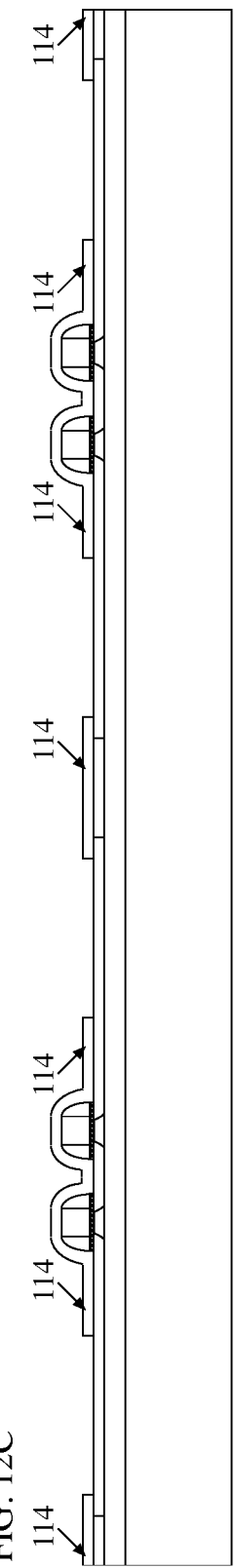

CMOS PIXELS COMPRISING EPITAXIAL LAYERS FOR LIGHT-SENSING AND LIGHT EMISSION

BACKGROUND OF THE INVENTION

The present invention relates to light emission from semiconductor junctions in general, and in particular when those junctions are operated in the avalanche mode, as the active regions of Avalanche Light Emitting Diodes (ALEDs), thereby enabling light emission from indirect bandgap materials. It relates to the design of device layers and layout, as well as the method of fabrication, suitable for monolithic integration of ALEDs with sub-micron and sub-100 nm CMOS technologies, forming "Light Emitting Elements" (hereafter referred to as LIXELs). LIXELs can be implemented with Silicon bulk substrates, Thick-Film SOI substrates, or ultra-thin-film Silicon-On-Insulator (SOI) substrates, as well as with Germanium bulk substrates or ultra-thin-film Germanium-On-Insulator (GOI) substrates. Thin-Film GOI substrates are good candidates to be used for sub-45 nm CMOS technology.

In the early years of semiconductor technology, it was noticed that silicon junctions operated in the avalanche mode emit white light. In fact it seems that light emission takes place across a large region of the electromagnetic spectrum, from the Long Wavelength Infra-Red (LWIR) to the Ultra-Violet (UV). Such wide interval of photon energies is an indication that different physical mechanisms, with different probabilities and efficiencies, are responsible for the emission of photons. Recent reviews of this topic can be found in: N. Akil, S. E. Kerns, D. V. Kerns, Jr., A. Hoffmann, J.-P. Charles, "A Multimechanism Model for Photon Generation by Silicon Junctions in Avalanche Breakdown", IEEE Trans. on Elect. Dev., Vol. 46, No. 5, May 1999, pp. 1022-1028, and M. de la Bardonnie, D. Jiang, S. E. Kerns, D. V. Kerns, Jr., P. Mialhe, J.-P. Charles, A. Hoffman, "On the Aging of Avalanche Light Emission from Silicon Junctions", IEEE Trans. on Elect. Dev., Vol. 46, No. 6, June 1999, pp. 1234-1239.

It is thought that some of those mechanisms are: (1) Interband transitions between (1a) hot electrons and thermal holes, (1b) hot holes and thermal electrons, (1c) hot electrons and hot holes; (2) Intraband transitions, (2a) in the conduction band, and/or (2b) in the valence band; (3) Brehmstrahlung due to scattering of hot carriers by ionized impurities.

Even though there has been ample experimental evidence since the 1950's that silicon can emit light, the efficiency has always been very low: roughly only 1 in $10^7$ recombinations across the bandgap emit light. This low efficiency is tied to the details of the band structure of silicon, namely the smallest bandgap is indirect at 1.1 eV, to device design/geometry, and to process architecture.

Conventional avalanche light emitting devices are made by ion implantation into a bulk substrate, to make either lateral or vertical pn-junctions. In either case, the location which emits light can be hundreds of nanometers away from the substrate surface, and consequently photons with energy larger than the minimum bandgap of the substrate are absorbed, thereby severely reducing the external power efficiency.

For all the reasons mentioned above, band-structure, device design, and process architecture, it has been impossible to take advantage for practical applications, of light emission from silicon junctions operated in the avalanche mode. On the other hand, conventional CMOS technology is not amenable to the integration of other semiconductor materials for the purpose of bandgap engineering of pn-junctions. For this reason full monolithic integration of efficient light emitting devices with CMOS has not been possible.

The present invention, based on the device and process architectures disclosed in WO 2002/33755, and in WO 2004/027879, and the new layout designs disclosed in a co-pending application, presents a new method of fabrication, device layers, and layout designs that enable the monolithic integration of ALEDs with advanced CMOS, including sub-100 nm technologies, in which the light emitting regions can be made of materials other than the semiconductor substrate (e.g., silicon or germanium). It also discloses optimized doping and heterojunction profiles for the purpose of increased efficiency of light emission, as well as optimized profiles for the purpose of light emission in certain ranges of wavelengths, namely in the 1.3 µm and 1.55 µm ranges.

The monolithic integration of ALEDs with advanced CMOS technology, in one exemplary implementation, requires only three additional masks, with respect to the number of masks required for the CMOS technology in question. It has been experimentally verified that the avalanche photodiodes described in WO 2002/33755 and WO 2004/027879, with one of the layouts described in co-pending application, do emit light under certain conditions of operation.

SUMMARY OF THE INVENTION

An object of the present invention is a new process architecture for the fabrication of photonic devices, that is compatible with sub-micron and sub-100 nm CMOS technologies and improves the intrinsic and extrinsic efficiencies of light emission by avalanching junctions.

1. Substrate can be Si bulk or SOI, Ge bulk or GOI, SiGe virtual substrates—on bulk silicon or on insulator, etc. The type of substrate to be used is related to the requirements of the CMOS technology that the device is to be monolithically integrated with.
2. For films deposited on bulk substrates, the acceleration region (region of high electric filed) can be located inside the substrate. In this case, the deposited film may include only the impact ionization region, or it may also include a region for "energy filtering".
3. In the deposited film, the region designed to maximize impact ionization, may have n-type or p-type conductivity.
4. For films deposited on thin-film or ultra-thin-film SOI or GOI substrates, the doping and hetero-junction profiles of the deposited films can be optimized for front-side light emission, or for back-side light emission, or for both.
5. For front-side light emission from films deposited on thin-film or ultra-thin-film SOI or GOI substrates, the films incorporate the "acceleration region", optionally an energy filtering region, the region in which light emission is to take place, which is at the same time an electrode.
6. For back-side light emission from films deposited on thin-film or ultra-thin-film SOI or GOI substrates, the films incorporate the optional energy filtering region, the acceleration region and the electrode opposite to the one in which light emission takes place.
7. For front-side and back-side light emission from films deposited on thin-film or ultra-thin-film SOT or GOI substrates, the films incorporate the acceleration region, and the top electrode. The top and bottom electrodes must be suitable for light emission, and the acceleration region must be suitable for light emission on both of its ends. Optional energy filtering regions may be placed at both ends of the acceleration region, or just at one end.

8. Regardless of substrate used, the acceleration region should be mono-crystalline, because charge carrier mobility should be as high as possible.
9. Regardless of substrate used, the region in which light emission takes place should be as thin as possible to minimize lateral light emission through the side walls.
10. The region in which light emission takes place can be bandgap engineered so that the photon energy of the emitted light can be below the threshold for interband absorption in the substrate.

Another object of the present invention is a new device architecture, compatible with sub-micron and sub-100 nm CMOS technologies, that improve the intrinsic and extrinsic efficiencies of light emission by avalanching junctions.
1. The region in which light emission by avalanching takes place is a thin-film, deposited on an active area.
2. Electric field and avalanche current, are perpendicular to substrate surface;
3. The deposited film in which light emission by avalanching takes place, can be a pure material, a random alloy, or a short-period superlattice.
4. The deposition of the light emitting film can be engineered to form pseudomorphic crystalline films, poly-crystalline films, or amorphous films. It is also possible to have a combination of films of different materials. For example, pseudomorphic crystalline followed by poly-crystalline, or pseudomorphic crystalline followed by amorphous, or pseudomorphic crystalline followed by poly-crystalline, followed by amorphous. In addition, it is also possible to deposited a crystalline film and subsequently, with suitable processing, make it nano-crystalline or porous.
5. During the deposition process, the heterojunction and doping profiles can be optimized, for one or more of the physical mechanisms involved in light emission, in order to maximize the intrinsic efficiency of the light emission process(es).
6. The heterojunction and doping profiles of the deposited film(s) can be optimized for efficient light emission in a particular range of wavelengths.
7. The heterojunction and doping profiles of the deposited film(s) can designed such that the deposited film is only used as the location for impact ionization.
8. The heterojunction and doping profiles of the deposited film (s), in addition to the location for impact ionization, can also incorporate regions that act as "energy filters", that is, regions which allow charge carriers with only a certain energy range, to move to the region in which impact ionization (i.e. avalanching) takes place.
9. The heterojunction and doping profiles of the deposited film, in addition to the location for impact ionization, can also incorporate the regions in which the charge carriers are accelerated.
10. The heterojunction and doping profiles of the deposited film, in addition to the location for impact ionization, can incorporate regions that act as "energy filters", and also incorporate the regions in which the charge carriers are accelerated.
11. The same device, when biased above the breakdown voltage emits light, and when biased below the breakdown voltage, can operate as an avalanche photo-diode.

Yet another object of the present invention is a new layout architecture, compatible with sub-micron and sub-100 nm CMOS technologies, that improve the intrinsic and extrinsic efficiencies of light emission by avalanching junctions.
1. For monolithic integration in a BiCMOS process with a vertical Bipolar device, typical of SiGe (or SiGeC) BiC-MOS process technologies, the active area for the light emitter can be either a CMOS active area or a Bipolar active area.
2. For monolithic integration in a pure CMOS process, the active area is a standard CMOS active area.
3. For monolithic integration with a pure CMOS process on bulk wafers, or thick-film SOI wafers, a conductive path to the bottom electrode of the light-emitting device is implemented with a well implant.
  3a. For a p-type deposited film, the active area is n-type on a p-substrate. A conductive path to the n-type active area is implemented with a n-Well implant that overlaps both sides of a portion of the shallow trench isolation surrounding the n-type active area.
  3b. For a n-type deposited film, the active area is p-type, on a n-substrate, or n-Well on a triple-well on p-substrate technology. A conductive path to the p-type active area is implemented with a p-Well implant that overlaps both sides of the shallow trench isolation surrounding the p-type active area.
  3c. With n-type active areas, the n-Well implant can also overlap the source/drain region of a N-MOSFET on an adjacent active area, thereby providing an extremely compact arrangement of the light emitting device coupled to a switching element.
  3d. With p-type active areas, the p-Well implant can also overlap the source/drain region of a P-MOSFET on an adjacent active area, thereby providing an extremely compact arrangement of the light emitting device coupled to a switching element.
4. For monolithic integration with pure CMOS process on thin-film SOI or GOI substrates, a lateral contact to the bottom electrode is provided by not fully encircling the active area with isolation.

BRIEF DESCRIPTION OF THE DRAWINGS

FIGS. 10A to 10E show the most relevant steps/modules of Process Flow #2.

FIGS. 11A to 11F show the most relevant steps/modules of Process Flow #3.

FIGS. 12A to 12G show the most relevant steps/modules of Process Flow #4.

DETAILED DESCRIPTION OF THE INVENTION

1. Method of Fabrication

Figure 1A:
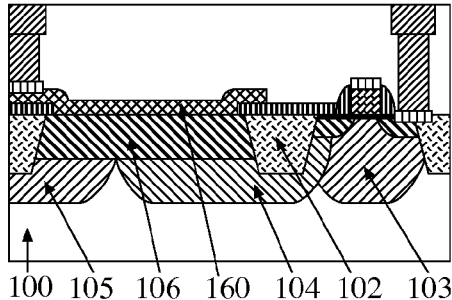
FIG. 1A presents a configuration for monolithic integration, showing one N-MOSFET connecting to the bottom electrode of one photonic device, in which the "Acceleration" region is n-type and is in the bulk, while the p-type epitaxial layer is the region in which light emission through impact ionization takes place. The contact to the bottom electrode is made outside the active area, through the n-Well implant.

The present invention makes use of the fabrication architecture and process flows disclosed in WO 2002/33755 which covers the fabrication of Avalanche Photo-Diodes (APDs) with epitaxially grown active layers, monolithically integrated with bulk CMOS devices. The fundamental advantage of that fabrication architecture is that some of the active layers of the APDs are epitaxially deposited on CMOS active areas, immediately adjacent to MOSFETs, thereby resulting in a very compact monolithic integration with CMOS. Because some of the active layers are epitaxial layers deposited on a silicon surface (active area), it is possible to have materials that are epitaxially compatible with silicon, other than silicon itself.

Similarly to WO 2002/33755 and WO 2004/027879, the method of fabrication of the present invention, follows the standard CMOS process flow until the formation of silicide layers. Ideally the epitaxial deposition takes place after all high temperature steps, such as the ion implantation and annealing of the source/drain CMOS junctions, have already taken place, so that the "as deposited" heterojunction and doping profiles are not modified by temperature induced diffusion and/or strain relaxation. In sub-100 nm CMOS, the subsequent processing steps, such as the silicide formation, as well as all metallization steps, can be performed at temperatures lower than those used for the epitaxial growth.

The method of fabrication of the present invention enables a very compact monolithic integration of APDs/ALEDs with advanced CMOS to form an "Active Matrix" of Pixels/Lixels, in which the APDs/ALEDs comprise epitaxially grown active layers with sophisticated doping and heterojunction profile engineering. This permits the fabrication of active regions with profoundly modified band structure, resulting in greatly improved optoelectronic characteristics with respect to the substrate (silicon or germanium, or a relaxed SiGe buffer layer). It must be emphasized that such sophisticated doping and heterojunction profile engineering are impossible with devices made without the epitaxial growth of those layers.

WO 2002/33755 provides the method of fabrication on bulk substrates and thick-film SOI. WO 2004/027879 provided the method of fabrication on thin-film SOI or GOI substrates, for front and/or back-side illumination. The present disclosure is applicable to bulk, thick-film and thin-film SOI or GOI substrates.

It should be noticed that the optimal device layers for light emission can also be fabricated on substrates without CMOS devices, resulting in a far simpler and lower cost process flow. Some applications, such as Solid State Lighting (SSL), do not require the monolithic integration of the advanced epitaxial layers with CMOS. In this case there are three options: (1) fabricate single large ALED/Lixel device, (2) fabricate 2-dimensional array of ALED/Lixel devices contacted in parallel, (3) fabricate 2-dimensional array of ALED/Lixel devices contacted individually through "passive matrix addressing".

The process flow disclosed in WO 2002/33755 is an example in which it is assumed that the thermal budget required for the epitaxial deposition of the SiGeC layers is sufficiently low to be performed after the formation of the highly-doped source/drain regions for deep submicron (e.g. 0.18 μm) CMOS technologies. Low temperature epitaxial deposition processes (including the pre-epitaxy surface preparation) have been demonstrated. However, the most commonly used processes in production still require somewhat larger thermal budgets to achieve the required films.

If the thermal budget for the epitaxial deposition of the SiGeC film is considered too high, then the deposition step could be inserted before the formation of the source/drain junctions. The thermal budget for epitaxial deposition of SiGeC films has been decreasing over time. It is widely acknowledged that there is a tendency towards lower thermal budgets, for this and many other process steps. It is reasonable to expect that at some time in the near future, production grade equipment and recipes will be compatible with the insertion of the epitaxial deposition step after the formation of the source/drain regions. Changing the substrate from silicon to germanium for CMOS technologies below 45 nm would further help decreasing the thermal budget because the germanium native oxide is very easily removed (it is water soluble), compared to the very stable silicon oxide. Therefore it is to be expected that germanium substrates/surfaces will enable multiple epitaxial deposition steps without impacting pre-existing doping/heterojunction profiles.

In the process flows described below, the "Isolation Module" can be conventional LOCOS or STI technologies, but STI will be the preferred one. Also, the "Ion Implantation Modules", as well as the "Silicide Modules", refer to the respective conventional process modules/steps/recipes.

In the following process flows, the details of materials, doping and heterojunction profiles, are not shown, because they are not needed for the description of the process flow, and because the process flow does not change if the details of those layers are changed.

The following is the list of layers/materials referenced in the Figures:

- 100—p-substrate
- 101—Active Area
- 102—STI
- 103—p-well
- 104—n-well
- 105—p-type doped regions (105), isolating adjacent photodiode active areas
- 106—n-type doped active area for epitaxial layers of APDs/ALEDs.
- 107—Gate Insulator of MOSFET
- 108—NMOS LDDs
- 109—Highly n-type doped region, such as NMOS Source/Drain regions (HDD)
- 110—Field Isolation of Thin-Film SOI
- 111—Gate electrodes
- 112—Nitride spacers
- 113—Deep Trench Isolation (DTI)
- 114—Nitride film as hard mask for epitaxy
- 115—Silicide
- 116—Pre-Metal Dielectric
- 117—Epitaxially deposited films—single crystal material over active areas
- 118—Epitaxially deposited films—amorphous/poly-crystalline material over field isolation areas
- 119—N-type implant into active areas of APD
- 120—Buried oxide of SOI substrates
- 121—SOI mechanical substrate
- 126—Light blocking layer
- 127—Red color filter
- 128—Green color filter
- 129—Blue Color filter
- 130—Contacts
- 131—Metal-1
- 150—Transparent substrate
- 151—N-type silicon substrate
- 152—Back-side metallization
- 160—P-type epitaxial layer which is also electrode and light emitting layer
- 161—N-type epitaxial layer which is also electrode and light emitting layer
- 162—Acceleration region for front-side light emission
- 163—Acceleration region for back-side light emission
- 164—Filtering region for front-side light emission 165—Filtering region for back-side light emission
166—P-type electrode
167—N-type electrode Exemplary Process Flow #1

Fabrication of multiple ALED/Lixel devices contacted individually through "active matrix addressing", made on a bulk substrate with a process flow for monolithic integration with CMOS devices. This exemplary process flow makes use of a twin-well process on a p-substrate silicon wafer. The flow described below indicates only the most important process modules.

Figure 9A:
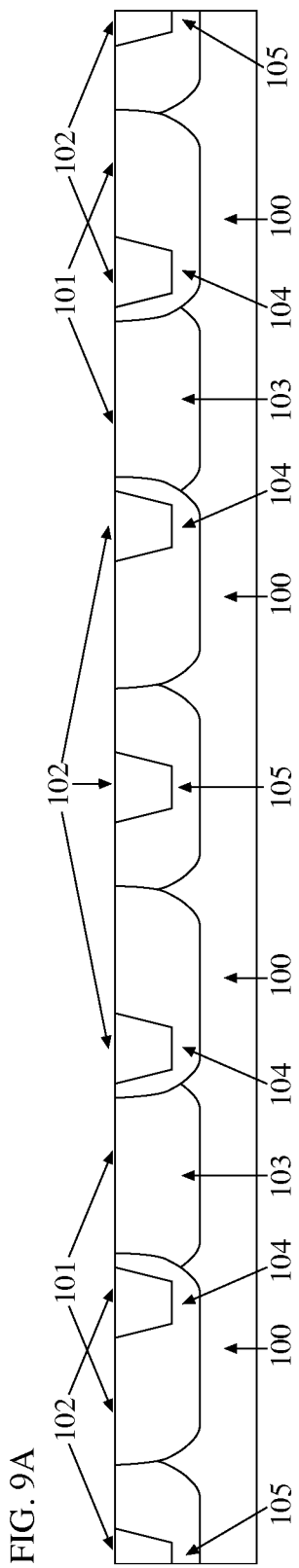
FIGS. 9A to 9H show the most relevant steps/modules of Process Flow #1.
Figure 9B:
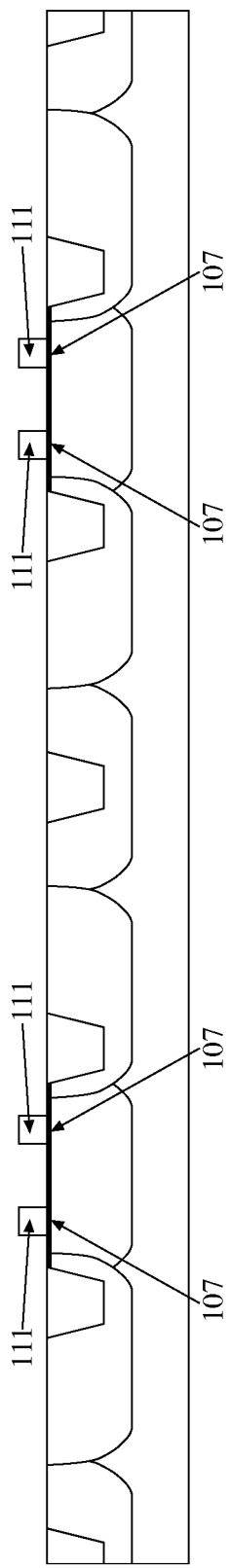
Figure 9C:
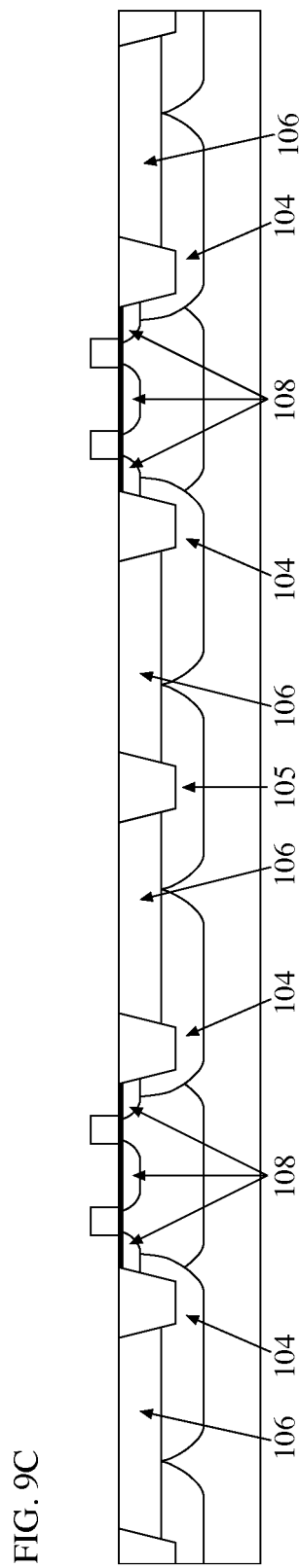
Figure 9D:
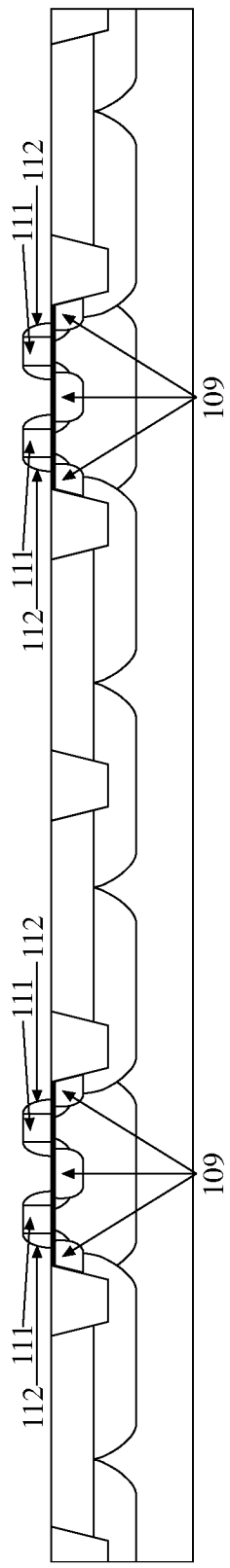
Figure 9E:
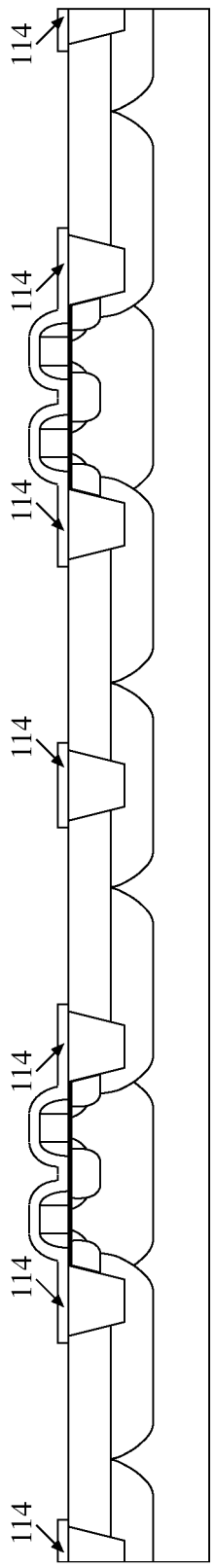
Figure 9F:
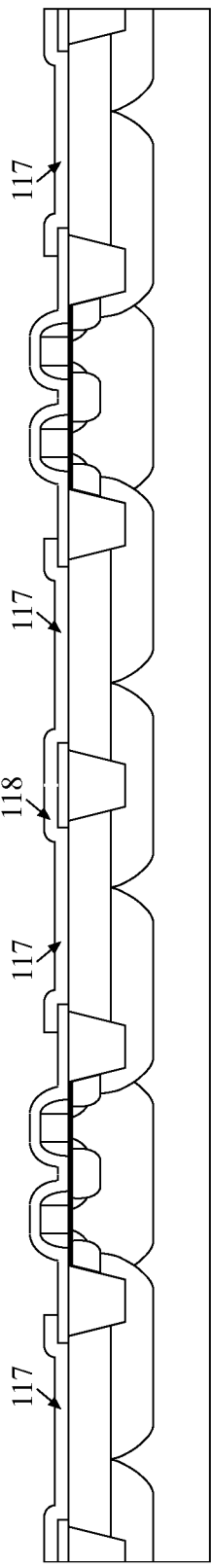
Figure 9G:
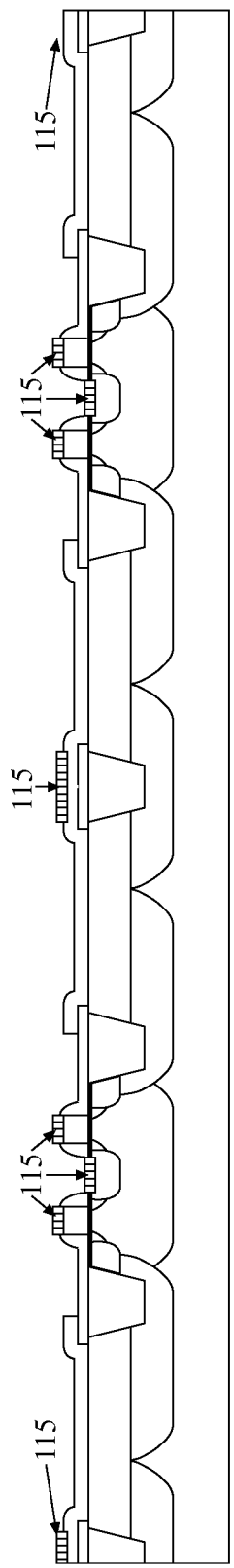
Figure 9H:
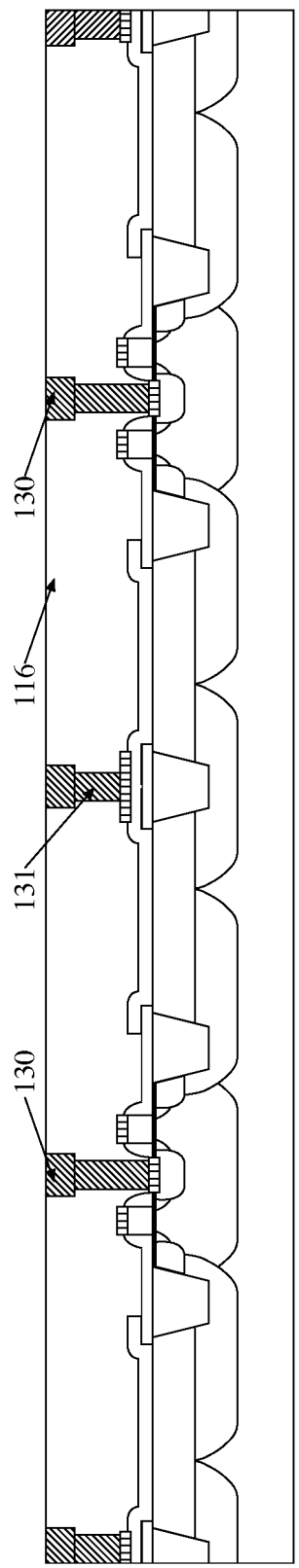

Sequence of Process Modules (FIGS. 9A to 9H):
"Isolation Module"
"P-Well Implant Module"
"N-Well Implant Module" (FIG. 9A)
"Poly-Gate Module" (FIG. 9B)
"NMOS LDD Implant Module"
"PMOS LDD Implant Module"
"Lixel Implant Module" (FIG. 9C)
"Nitride Spacer Module"
"NMOS HDD Implant Module" (FIG. 9D)
"Pre-Epitaxy Module" (FIG. 9E)
  A. Deposition of $Si_3N_4$ to be used as a hard mask for epitaxy;
  B. Photolithography defining the windows where the epitaxial films are to be grown;
  C. Etch to open windows over the active areas onto which epitaxial layers will be grown;
  D. Photoresist strip and clean;
"Epitaxy Module" (FIG. 9F)
  A. Pre-epitaxy clean;
  B. Epitaxial growth of the layers with optimized doping and heterojunction profiles. The epitaxial growth can be selective or non-selective. The figure shows a non-selective growth;
  C. Photolithography defining where the epitaxial films are to be removed;
  D. Etch to remove epitaxial layers, stopping on the $Si_3N_4$ film underneath;
  E. Photoresist strip and clean;
"Silicide Module" (FIG. 9G)
  Formation of Silicide with Conventional Methods/Recipes:
  A. Deposition of $Si_3N_4$ to be used as a hard mask for silicide formation;
  B. Photolithography defining the windows where a silicide is to be formed;
  C. Etch to open windows over the active areas in which a silicide will be formed;
  D. Photoresist strip and clean;
  E. Deposition (for example by sputtering) of a metal film;
  F. Thermal annealing to form a silicide
  G. Removal (for example, selective wet etch) of unreacted metal;
"Metallization Module" (FIG. 9H)
  The metallization technology to be used can be the same used in standard CMOS technology. The thickness of the epitaxial layers, if it exceeds the typical thickness of the poly silicon gates of a given CMOS technology, might require some fine tuning of the planarization before forming contacts and metal-1 lines.

Exemplary Process Flow #2

Fabrication of multiple ALED/Lixels devices contacted individually through "passive matrix addressing", made on a bulk substrate with a process flow simpler than the one required for monolithic integration with CMOS devices. This exemplary process flow makes use of p-substrate silicon wafers, and skips many steps used to fabricate standard CMOS devices.

Figure 10D:
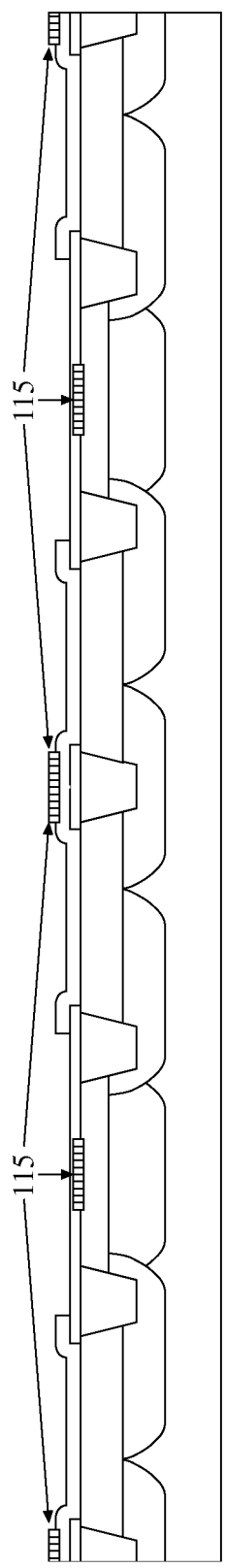
Figure 10E:
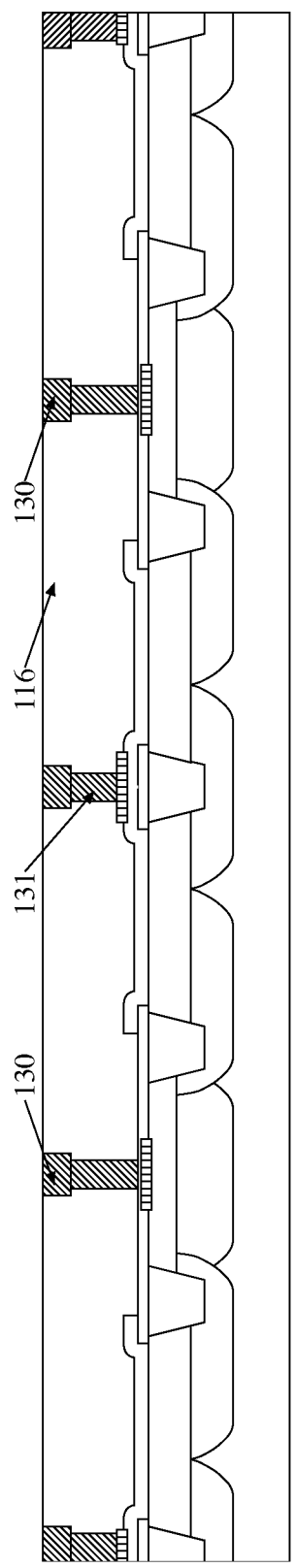

Sequence of Process Modules (FIGS. 10A to 10E):
"Isolation Module"
"Ion Implantation Module" (FIG. 10A)
  This module defines the locations to be ion implanted with n-type dopants.
  In a preferred embodiment, there are three separate patterned ion implantation steps.
    A first implant is the standard N-Well implant in CMOS processes, overlapping active areas and isolation regions.
    A second implant into the active areas, will create doping levels similar to those used at the collector region of high-speed HBT devices in BiCMOS process. The second implant overlaps the N-Well implant along pre-determined regions.
    A third implant overlaps the N-Well implant along pre-determined regions, and provides high dopant concentration in pre-defined surface regions.
"Pre-Epitaxy Module" (FIG. JOB)
  A. Deposition of $Si_3N_4$ to be used as a hard mask for epitaxy;
  B. Photolithography defining the windows where the epitaxial films are to be grown;
  C. Etch to open windows over the active areas onto which epitaxial layers will be grown;
  D. Photoresist strip and clean;
"Epitaxy Module" (FIG. 10C)
  A. Pre-epitaxy clean;
  B. Epitaxial growth of the layers with optimized doping and heterojunction profiles. The epitaxial growth can be selective or non-selective. The figure shows a non-selective growth;
  C. Photolithography defining where the epitaxial films are to be removed;
  D. Etch to remove epitaxial layers, stopping on the $Si_3N_4$ film underneath;
  E. Photoresist strip and clean;
"Silicide Module" (FIG. 10D)
  Formation of Silicide with Conventional Methods/Recipes:
  A. Deposition of $Si_3N_4$ to be used as a hard mask for silicide formation;
  B. Photolithography defining the windows where a silicide is to be formed;
  C. Etch to open windows over the active areas in which a silicide will be formed;
  D. Photoresist strip and clean;
  E. Deposition (for example by sputtering) of a metal film;
  F. Thermal annealing to form a silicide
  G. Removal (for example, selective wet etch) of unreacted metal;
"Metallization Module" (FIG. JOE)
  The metallization technology to be used can be the same used in standard CMOS technology. The thickness of the epitaxial layers, if it exceeds the typical thickness of the poly silicon gates of a given CMOS technology, might require some fine tuning of the planarization before forming contacts and metal-1 lines.

Exemplary Process Flow #3

Fabrication of multiple ALED/Lixel devices, all contacted simultaneously in parallel, made on a bulk substrate with a process flow simpler than the one required for monolithic integration with CMOS devices. This exemplary process flow makes use of n-substrate silicon wafers, and skips many steps used to fabricate standard CMOS devices. With this flow the contact to the bottom electrode is made through the back-side of the substrate, and that is why n-type substrate is used.

Sequence of Process Modules (FIGS. 11A to 11F):

"Isolation Module"

Figure 11A:
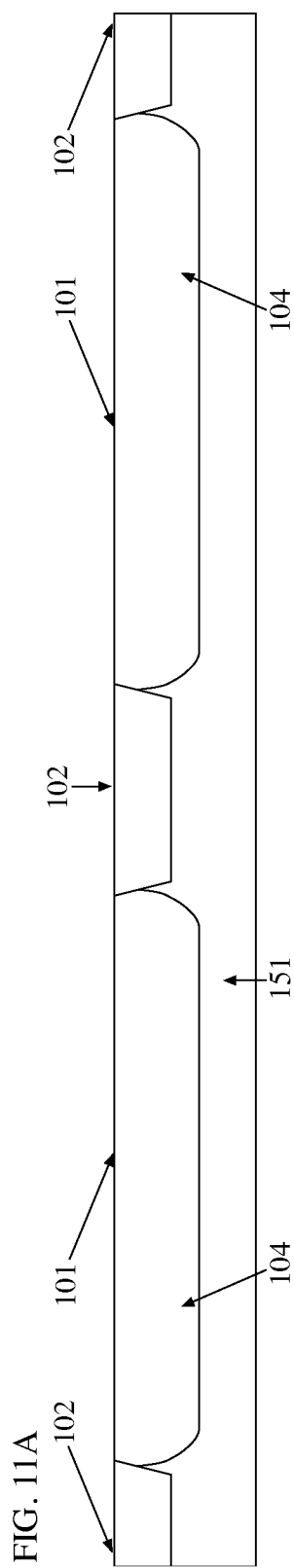

"Ion Implantation Module" (FIG. 11A)

With a n-type substrate, and contact to the bottom electrode being made through the back-side of the (thinned) wafer, there is no need for N-Well implant, nor for an implant to produce high n-type dopant concentration near the surface of the wafer.

Implant into the active areas, to create doping levels similar to those used at the collector region of high-speed HBT devices in BiCMOS process. The mask for this patterned implant overlaps the active areas in order to leave lower doping regions around the isolation regions.

Figure 11B:
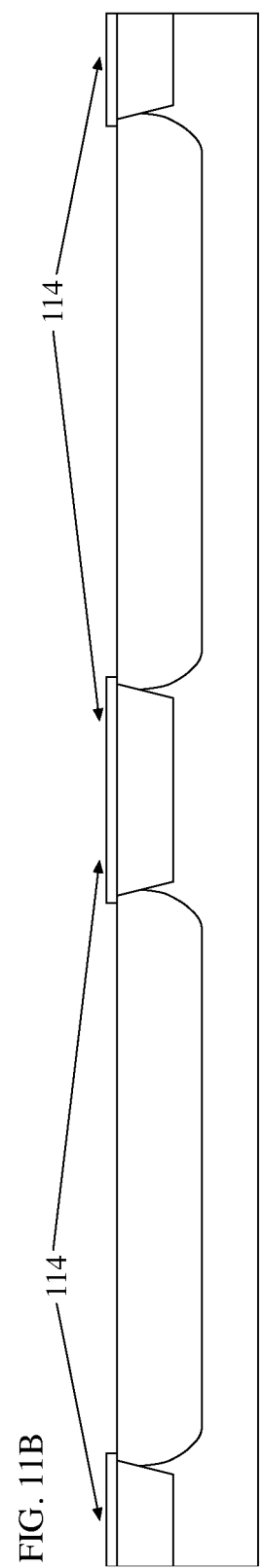

"Pre-Epitaxy Module" (FIG. 11B)

Figure 11C:
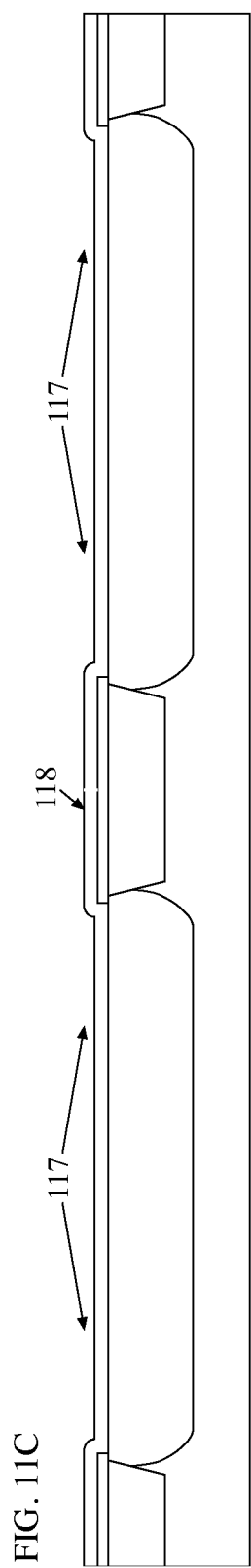

A. Deposition of $Si_3N_4$ to be used as a hard mask for epitaxy;

B. Photolithography defining the windows where the epitaxial films are to be grown;

C. Etch to open windows over the active areas onto which epitaxial layers will be grown;

D. Photoresist strip and clean;

"Epitaxy Module" (FIG. 11C)

A. Pre-epitaxy clean;

B. Epitaxial growth of the layers with optimized doping and heterojunction profiles. The epitaxial growth can be selective or non-selective. The figure shows a non-selective growth;

C. Photolithography defining where the epitaxial films are to be removed;

D. Etch to remove epitaxial layers, stopping on the $Si_3N_4$ film underneath;

E. Photoresist strip and clean;

"Silicide Module" (FIG. 11D)

Formation of Silicide with Conventional Methods/Recipes:

A. Deposition of $Si_3N_4$ to be used as a hard mask for silicide formation;

B. Photolithography defining the windows where a silicide is to be formed;

C. Etch to open windows over the active areas in which a silicide will be formed;

D. Photoresist strip and clean;

E. Deposition (for example by sputtering) of a metal film;

F. Thermal annealing to form a silicide

G. Removal (for example, selective wet etch) of unreacted metal;

"Metallization Module" (FIG. 11E)

The metallization technology to be used can be the same used in standard CMOS technology. The thickness of the epitaxial layers, if it exceeds the typical thickness of the poly silicon gates of a given CMOS technology, might require some fine tuning of the planarization before forming contacts and metal-1 lines. In a typical application, the metallization module will have just one metal level.

"Back-Side Module" (FIG. 11F)

Deposition and annealing of a metal (for example aluminum) on the back-side of the wafer, to form the contact to the bottom electrode of the devices fabricated on the front-side of the wafer. Prior to the deposition of the metal on the back-side, the wafer is thinned to minimize the series resistance to the structures fabricated on the front side.

Exemplary Process Flow #4

Fabrication of multiple ALED/Lixels devices contacted individually through "active matrix addressing", made on a Thin-Film SOI (or GOI) substrate with a process flow for monolithic integration with CMOS devices. The flow described below indicates only the most important process modules.

Sequence of Process Modules (FIGS. 12A to 12G):

"Isolation Module" (FIG. 12A)

"Poly-Gate Module" & "NMOS S/D Implant Module" (FIG. 12B)

"Pre-Epitaxy Module" (FIG. 12C)

Figure 12D:
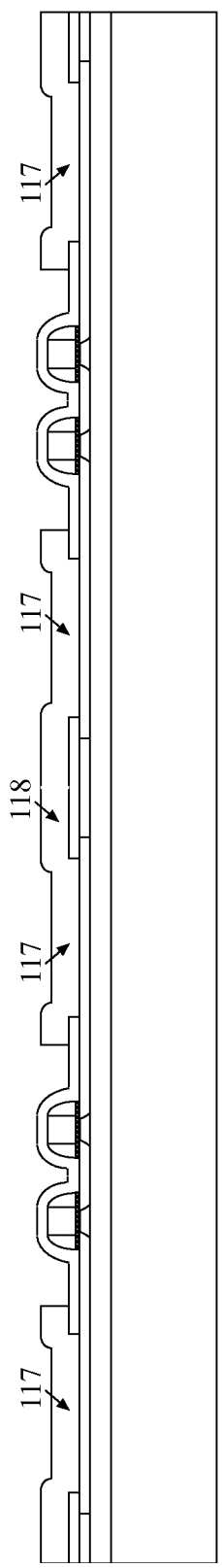

A. Deposition of $Si_3N_4$ to be used as a hard mask for epitaxy;

B. Photolithography defining the windows where the epitaxial films are to be grown;

C. Etch to open windows over the active areas onto which epitaxial layers will be grown;

D. Photoresist strip and clean;

"Epitaxy Module" (FIG. 12D)

Figure 12E:
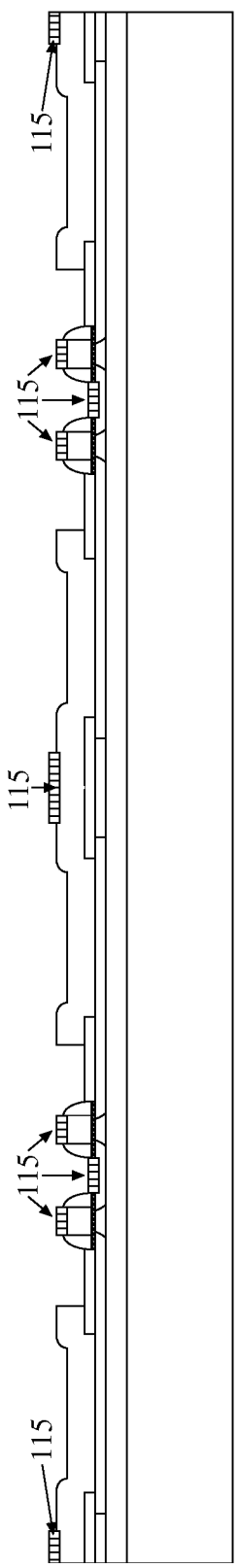

A. Pre-epitaxy clean;

B. Epitaxial growth of the layers with optimized doping and heterojunction profiles. The epitaxial growth can be selective or non-selective. The figure shows a non-selective growth;

C. Photolithography defining where the epitaxial films are to be removed;

D. Etch to remove epitaxial layers, stopping on the $Si_3N_4$ film underneath;

E. Photoresist strip and clean;

"Silicide Module" (FIG. 12E)

Formation of Silicide with Conventional Methods/Recipes:

A. Deposition of $Si_3N_4$ to be used as a hard mask for silicide formation;

B. Photolithography defining the windows where a silicide is to be formed;

C. Etch to open windows over the active areas in which a silicide will be formed;

D. Photoresist strip and clean;

E. Deposition (for example by sputtering) of a metal film;

F. Thermal annealing to form a silicide

Figure 12F:
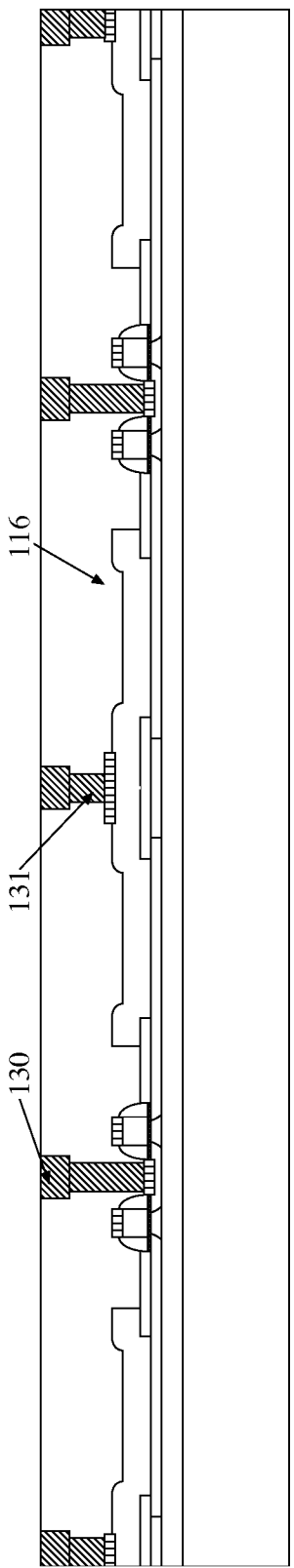

G. Removal (for example, selective wet etch) of unreacted metal;

"Metallization Module" (FIG. 12F)

The metallization technology to be used can be the same used in standard CMOS technology. The thickness of the epitaxial layers, if it exceeds the typical thickness of the poly silicon gates of a given CMOS technology, might require some fine tuning of the planarization before forming contacts and metal-1 lines.

Figure 12G:
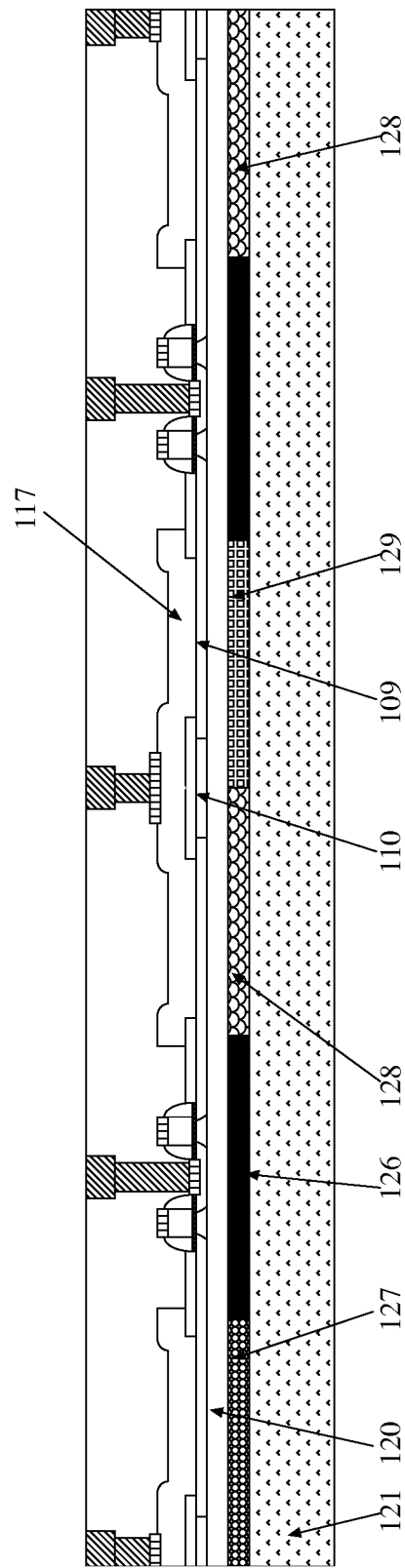

Optional "Backside Processing Module" (FIG. 12G)

After all processing has been done on the front-side of the substrate, there is an option to remove the back-side of the substrate. The buried oxide provides a marking layer for whatever method of removing the back-side is applied. Then the fully processed SOI (or GOI) layer can either:

(1) Be directly bonded to a new substrate, which can be light transparent or opaque, and can be an insulator or a conductor;

(2) Undergo processing on the newly exposed surface of the buried oxide, and then bonded to a new substrate.

Processing on the newly exposed surface of the buried oxide can be used for the purpose of:

(A) Electrical connections of structures made on the front-side of the wafer, (B) Fabrication of additional electrical, and/or electronic, and/or optical, optoelectronic devices. Examples of such devices can be Antennas, vertical and/or horizontal Optical (half-) Cavities, Surface Plasmon-Polariton (SPP) structures such as "Light Funnels" (WO 2004/027879), etc. It should be noticed that the fabrication of an optical half-cavity on the back-side could be complemented with the fabrication of an half-cavity on the front side, immediately after the "Epitaxy Module", and before the "Silicide Module".

The configuration shown in FIG. 12G is obtained through the following sequence of process steps:
A. Temporary bonding of the front-side of the wafer to a mechanical holder;
B. Removal of the silicon bulk substrate of the SOI (or GOI) wafer, using the buried oxide as a marker layer;
C. Fabrication of color filters and light-blocking layers on the exposed surface of the buried oxide;
D. Optional permanent bonding to a transparent substrate;

2. Types of Substrates and Epitaxial Layers

The method of fabrication of the present invention, can be implemented for different substrate materials (e.g., bulk silicon or germanium, Thick-Film SOI or GOI, Thin-Film SOI or GOI) and different orientations (<100>, <111>, etc.). Naturally there are differences with respect to the epitaxial films that can be grown on different materials and orientations, with consequences on the optoelectronic properties, and therefore on the performance and functionality.

It has been demonstrated that patterned areas of silicon substrates can be processed to achieve mono-layer flatness as demonstrated by S. Tanaka, G. C. Umbach, J. M. Blakely, R. M. Tromp, M. Mankos, "Fabrication of arrays of large step-free regions on Si(001)", Appl. Phys. Lett, Vol. 69, No. 9, pp. 1235, 26 Aug. 1996, and D. Lee, J. Blakely, "Formation and stability of large step-free areas on Si(001) and Si(111)", Surf. Sci. Vol. 445, pp. 32, 2000; which is the ideal surface for the epitaxial growth of high quality pseudomorphic random alloys and short period superlattices. The processing required to produce atomic mono-layer flat active areas is compatible with the process flows of WO 2002/33755 and WO 2004/027879, as well as the layouts of a co-pending application, so that the photonic active layers of the devices in the current disclosure can be fabricated on such surfaces.

Independently of substrate material and orientation, the ALEDs require a certain functionality from the active layers: a first electrode, an "acceleration" region, an optional "energy filtering region", and an "impact ionization" or "avalanching" region which is also the second electrode. For example, for a device made on a n-well on a p-substrate, the bottom electrode is n-type, and the top electrode, is p-type. The "acceleration" and "energy filtering" regions can be undoped.

From these requirements it can be immediately inferred that devices made on thin-film SOI or GOI must have the "acceleration" to be a part of the epitaxial stack, while for devices made on bulk or thick-film SOI substrates, carriers can be accelerated in the substrate. With bulk or thick-film SOI substrates the "acceleration" region can also be epitaxially grown, which enables bandgap engineering through carefully designed heterojunction profiles, with many potential advantages over an "acceleration" region made in a single homogeneous material.

An "energy filtering" region for electrons and/or holes can be made with a superlattices, as shown by J. Martorell, D. W. L. Sprung and G. V. Morozov, "Design of electron band pass filters for electrically biased finite superlattices", Phys. Rev. B 69, 115309, 2004. The purpose of building such layers into the epitaxial stack, just before the formation of the "avalanching" region (top electrode), is to restrict the flux of carriers into the "avalanching" layer, to only those with energy within a certain range. That energy range is chosen to be the one that provides the highest probability of generating a radiative transition inside the "avalanching" region. As a consequence, the flux of carriers with energy outside the ideal range is suppressed, thereby sharply decreasing the total current, thus decreasing the total power dissipation, and therefore significantly increasing the overall power efficiency.

Ideally, the "energy filtering" region performs in such away that every single carrier that is able to cross it, causes an impact ionization event that results in the emission of a photon. In such a scenario, the efficiency of avalanche light emission from an indirect bandgap material would approach the efficiency of light emission by the recombination of thermal carriers in direct bandgap materials.

Thin-Film SOI or GOI substrates allow the design of ALEDs for back-side emission of photons with energy larger than the bandgap of the substrate (e.g., silicon or germanium). The buried oxide layer is a perfect marking layer for the removal of the silicon or germanium mechanical substrates, thus enabling processing directly on the back-side of the buried oxide, and subsequent bonding to a transparent substrate. One of the many possibilities enabled by back-side processing is the fabrication of optical cavities. This is particularly useful for vertical cavity emitting devices.

A conventional resonant optical cavity would typically require the fabrication of half-cavity on the front-side, and another half-cavity of the back-side of the light emitting layer. Newer concepts, employing Surface Plasmon Polaritons (SPPs), which require the fabrication of patterned thin films of noble metals that are not compatible with conventional CMOS layouts and/or processing, can be easily implemented on the back-side of these substrates, after finishing all CMOS-compatible processing on the front-side, as already disclosed in WO 2004/027879.

Some of the combinations of substrate types and functional layers formed during the epitaxial deposition can be seen in FIGS. 1A-1C, FIGS. 2A-2C, FIGS. 3A-3D and 4A-4D.

Figure 1B:
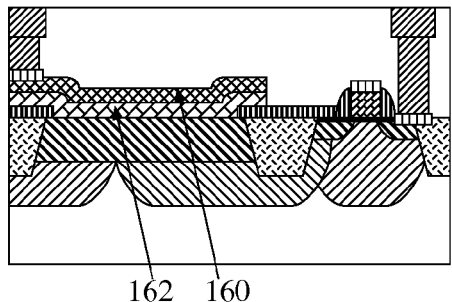
FIG. 1B shows a configuration which differs from that of FIG. 1A, in that the "Acceleration" region is epitaxially deposited on a highly n-type doped surface. The "Acceleration" region can be undoped or lowly doped.
Figure 1C:
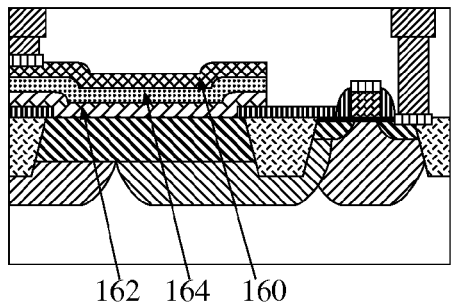
FIG. 1C shows a configuration which differs from that of FIG. 1B, in that the "Acceleration" region is epitaxially deposited on a highly n-type doped surface, and an optional "energy filtering" region is placed between the "Acceleration" and the region in which light emission through impact ionization takes place. The "Acceleration" and the "Filtering" regions can be undoped or lowly doped.

The combinations shown in FIGS. 1A-1C depict the monolithic integration, made on bulk substrates, of the photonic device of the present invention, in some of its multiple possible configurations, with a N-MOSFET which is connected to the bottom electrode of one photonic device.

FIG. 1A shows a photonic device configuration in which the "Acceleration" region is n-type and is in the bulk, while the p-type epitaxial layer is the region in which light emission through impact ionization takes place. The contact to the bottom electrode is made outside the active area, through the n-Well implant overlapping a n-type doped region that is part of the source/drain region of a N-MOSFET.

FIG. 1B shows a configuration which differs from that of FIG. 1A, in that the "Acceleration" region is epitaxially deposited on a highly n-type doped surface. The "Acceleration" region can be undoped or lowly doped. while FIG. 1C shows a configuration which differs from that of FIG. 1B, in that the "Acceleration" region is epitaxially deposited on a highly n-type doped surface, and an optional "energy filtering" region is placed between the "Acceleration" and the region in which light emission through impact ionization takes place. Also in this case, the "Acceleration" and the "Filtering" regions can be undoped or lowly doped.

Figure 2A:
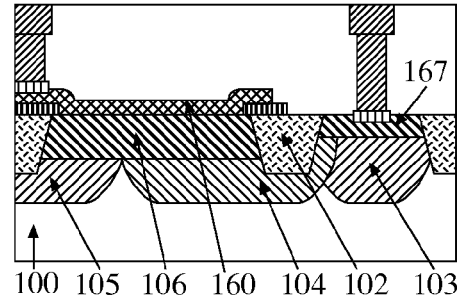
FIG. 2A presents a configuration, which may or may not be monolithically integrated with CMOS, made on bulk substrates, showing one photonic device and the contacts to the top and bottom electrodes, in which the "Acceleration" region is n-type and is in the bulk, while the p-type epitaxial layer is the region in which light emission through impact ionization takes place. The contact to the bottom electrode is made outside the active area, through the n-Well implant.
Figure 2B:
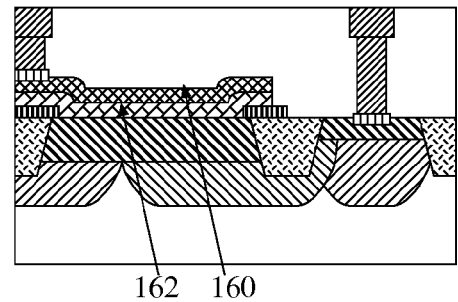
FIG. 2B shows a configuration which differs from that of FIG. 2A, in that the "Acceleration" region is epitaxially deposited on a highly n-type doped surface. The "Acceleration" region can be undoped or lowly doped.
Figure 2C:
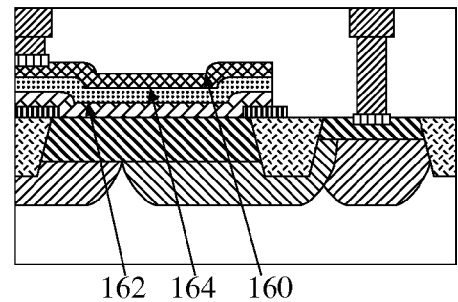
FIG. 2C shows a configuration which differs from that of FIG. 2B, in that the "Acceleration" region is epitaxially deposited on a highly n-type doped surface, and an optional "energy filtering" region is placed between the "Acceleration" and the region in which light emission through impact ionization takes place. The "Acceleration" and the "Filtering" regions can be undoped or lowly doped.

The combinations shown in FIGS. 2A-2C depict configurations, made on bulk substrates, which may or may not be monolithically integrated with CMOS, showing one photonic device and the contacts to the top and bottom electrodes of said photonic device.

FIG. 2A presents a configuration in which the "Acceleration" region is n-type and is in the bulk, while the p-type epitaxial layer is the region in which light emission through impact ionization takes place. The contact to the bottom electrode is made outside the active area, through the n-Well implant overlapping with a highly n-type doped region near the surface of the substrate.

FIG. 2B shows a configuration which differs from that of FIG. 2A, in that the "Acceleration" region is epitaxially deposited on a highly n-type doped surface. The "Acceleration" region can be undoped or lowly doped, while FIG. 2C shows a configuration which differs from that of FIG. 2B, in that the "Acceleration" region is epitaxially deposited on a highly n-type doped surface, and an optional "energy filtering" region is placed between the "Acceleration" and the region in which light emission through impact ionization takes place. Here also the "Acceleration" and the "Filtering" regions can be undoped or lowly doped.

The combinations shown in FIGS. 3A-3D depict the monolithic integration, made on ultra-thin film SOI or GOI substrates, of the photonic device of the present invention, in some of its multiple possible configurations, with a N-MOSFET which is connected to the bottom electrode of one photonic device.

Figure 3A:
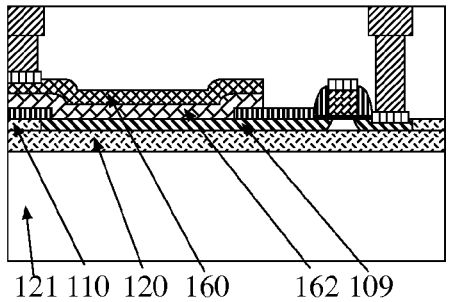
FIG. 3A presents a configuration for monolithic integration on ultra-thin film SOI or GOI substrates, showing one N-MOSFET connecting to the bottom electrode of one photonic device, for front-side light emission without a "Filter" region. The "Accelerator" region, which can be undoped, can be deposited directly on the n-type active area, followed by the deposition of the p-type film for light emission by impact ionization.

FIG. 3A presents a configuration for front-side light emission without a "Filter" region. The "Accelerator" region, which can be undoped, can be deposited directly on the n-type active area, followed by the deposition of the p-type film for light emission by impact ionization.

Figure 3B:
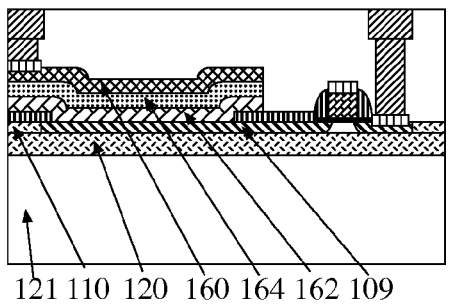
FIG. 3B presents a configuration for monolithic integration on ultra-thin film SOI or GOI substrates, showing one N-MOSFET connecting to the bottom electrode of one photonic device, for front-side light emission with a "Filter" region. The "Accelerator" region, which can be undoped, can be deposited directly on the n-type active area, followed by the "Filter" layers, and the deposition of the p-type film for light emission by impact ionization.

FIG. 3B presents a configuration for front-side light emission with a "Filter" region. The "Accelerator" region, which can be undoped, can be deposited directly on the n-type active area, followed by the "Filter" layers, and the deposition of the p-type film for light emission by impact ionization.

Figure 3C:
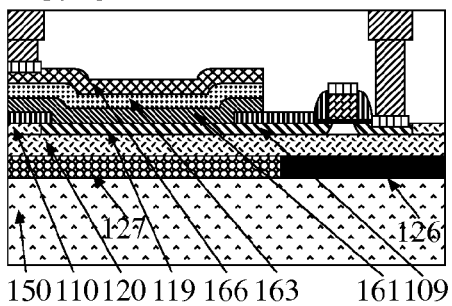
FIG. 3C presents a configuration for monolithic integration on ultra-thin film SOI or GOI substrates, showing one N-MOSFET connecting to the bottom electrode of one photonic device, for back-side light emission without a "Filter" region. The "Accelerator" region, which can be undoped, can be deposited directly on the n-type active area, followed by the deposition of the p-type film for light emission by impact ionization.

FIG. 3C presents a configuration for back-side light emission without a "Filter" region which can be undoped, can be deposited directly on the n-type active area, followed by the deposition of the p-type film for light emission by impact ionization.

Figure 3D:
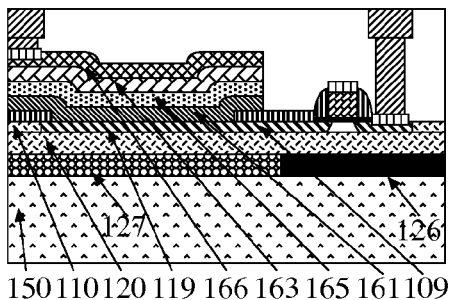
FIG. 3D presents a configuration for monolithic integration on ultra-thin film SOI or GOI substrates, showing one N-MOSFET connecting to the bottom electrode of one photonic device, for back-side light emission with a "Filter" region. The "Accelerator" region, which can be undoped, can be deposited directly on the n-type active area, followed by the "Filter" layers, and the deposition of the p-type film for light emission by impact ionization.

FIG. 3D presents a configuration for back-side light emission with a "Filter" region. The "Accelerator" region, which can be undoped, can be deposited directly on the n-type active area, followed by the "Filter" layers, and the deposition of the p-type film for light emission by impact ionization.

The combinations shown in FIGS. 4A-4D, depict configurations, made on ultra-thin film SOI or GOI substrates, of the photonic device of the present invention, in some of its multiple possible configurations, which may or may not be monolithically integrated with CMOS, showing one photonic device and the contacts to the top and bottom electrodes of said photonic device.

Figure 4A:
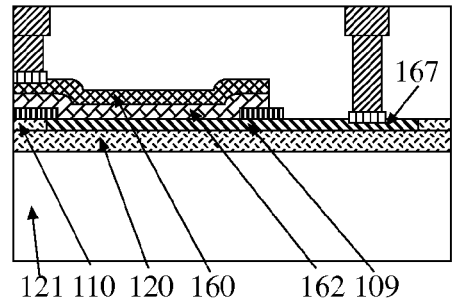
FIG. 4A presents a configuration, which may or may not be monolithically integrated with CMOS, made on ultra-thin film SOI or GOI substrates, showing one photonic device and the contacts to the top and bottom electrodes, for front-side light emission without a "Filter" region. The "Accelerator" region, which can be undoped, can be deposited directly on the n-type active area, followed by the deposition of the p-type film for light emission by impact ionization.

FIG. 4A presents a configuration for front-side light emission without a "Filter" region. The "Accelerator" region, which can be undoped, can be deposited directly on the n-type active area, followed by the deposition of the p-type film for light emission by impact ionization.

Figure 4B:
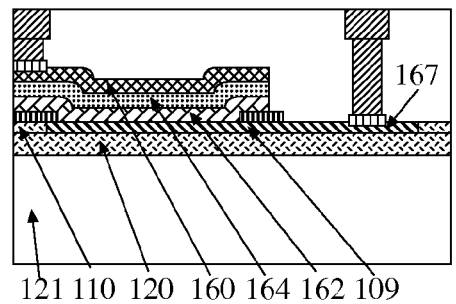
FIG. 4B presents a configuration, which may or may not be monolithically integrated with CMOS, made on ultra-thin film SOI or GOI substrates, showing one photonic device and the contacts to the top and bottom electrodes, for front-side light emission with a "Filter" region. The "Accelerator" region, which can be undoped, can be deposited directly on the n-type active area, followed by the "Filter" layers, and the deposition of the p-type film for light emission by impact ionization.

FIG. 4B presents a configuration for front-side light emission with a "Filter" region. The "Accelerator" region, which can be undoped, can be deposited directly on the n-type active area, followed by the "Filter" layers, and the deposition of the p-type film for light emission by impact ionization.

Figure 4C:
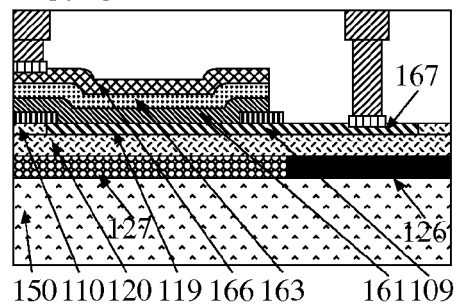
FIG. 4C presents a configuration, which may or may not be monolithically integrated with CMOS, made on ultra-thin film SOI or GOI substrates, showing one photonic device and the contacts to the top and bottom electrodes, for back-side light emission without a "Filter" region. The "Accelerator" region, which can be undoped, can be deposited directly on the n-type active area, followed by the deposition of the p-type film for light emission by impact ionization.

FIG. 4C presents a configuration for back-side light emission without a "Filter" region. The "Accelerator" region, which can be undoped, can be deposited directly on the n-type active area, followed by the deposition of the p-type film for light emission by impact ionization.

Figure 4D:
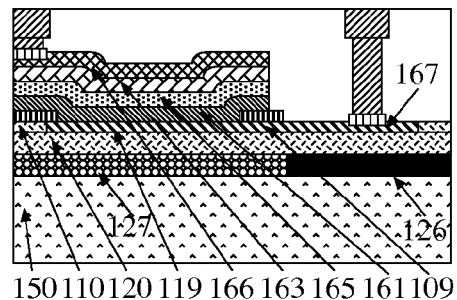
FIG. 4D presents a configuration, which may or may not be monolithically integrated with CMOS, made on ultra-thin film SOI or GOI substrates, showing one photonic device and the contacts to the top and bottom electrodes, for back-side light emission with a "Filter" region. The "Accelerator" region, which can be undoped, can be deposited directly on the n-type active area, followed by the "Filter" layers, and the deposition of the p-type film for light emission by impact ionization.

FIG. 4D presents a configuration for back-side light emission with a "Filter" region. The "Accelerator" region, which can be undoped, can be deposited directly on the n-type active area, followed by the "Filter" layers, and the deposition of the p-type film for light emission by impact ionization.

3. Device "Active Layers"

As already described in the previous section, there are several groups of "active layers". The bottom electrode, the "acceleration" region, the optional "energy filtering" region, and the "avalanching" region, which is the region in which light emission through impact ionization takes place, and that can be simultaneously the top electrode.

It is in the "acceleration" region that thermal carriers gain the necessary energy to successfully cause impact ionization in an adjacent "avalanching" region. The ability to gain energy from the electric field in the "acceleration" region depends on the electron and/or hole mobility in that region: the higher the mobility the larger the number of carriers acquiring the desired energy level to cause impact ionization. Therefore, it is highly advantageous for the "acceleration" region to be an undoped or lowly doped, single-crystalline region. The acceleration region can be designed to be part of the substrate of bulk wafers or thick-film SOI substrates, or can be epitaxially grown on any type of substrate: bulk, thick-film SOI, or thin-film SOI or GOI. With an epitaxially grown "acceleration" region, it is also possible to have sophisticated heterojunction and or doping profiles to enhance performance and/or functionality.

The optional "energy filtering" region, if implemented with a superlattice, requires single crystal epitaxial films with heterojunction engineering at the mono-layer level. Therefore this optional set of device layers must be epitaxially grown, regardless of the type of substrate.

In a preferred implementation, the "avalanching" region is also a single crystalline film with sophisticated heterojunction and doping profiles. However, it may also be a non-pseudomorphic film (alloys and/or superlattices), such as poly-crystalline, nano-crystalline, amorphous, or porous, of any of the materials listed below, and that can be formed on the silicon or germanium substrates.

The following subsections of the present disclosure provide more detailed information about different classes of materials/layers that can be used as the light emitting layer.

3.1. Epitaxial Layers Using Only Group IV Elements (C, Si, Ge, Sn) on Si Substrates For reasons mentioned earlier, an exemplary implementation for monolithic integration with current state of the art CMOS technology is straightforward with random alloys and/or superlattices of pseudomorphic $Si_{1-x}Ge_x$, and/or $Si_{1-y}C_y$, and/or $Si_{1-x-y}Ge_xC_y$, and/or $Ge_{1-x}C_x$, strained to Si substrates, with any of the more relevant crystal orientations, such as (100), (111), or (311) for example.

The integration of random alloys and/or superlattices of pseudomorphic $Si_{1-x}Ge_x$, and/or $Si_{1-y}C_y$, and/or $Si_{1-x-y}Ge_xC_y$, or and/or $Ge_{1-z}C_z$, strained to Si substrates, and their incorporation into a device design in which light emission due to avalanche takes place inside those films/materials, enables performance and functionality gains that are more significant than a slight improvement upon pure silicon devices. The reason for a qualitative jump in performance, such as increased efficiency of radiative transitions, as well as functionality by the selection of preferential range of wavelengths, is related to the qualitative differences between the band structure of silicon and germanium, and their combinations into random alloys and superlattices.

While in silicon the difference in energy between the indirect bandgap (1.1 eV) and the lowest direct bandgap (3.2 eV) is 2.1 eV, in germanium the difference between the indirect bandgap (0.66 eV) and the smallest direct bandgap (0.8 eV) is only 0.14 eV. For germanium, it is only necessary to add 0.14 eV of kinetic energy to the thermal electrons in the L-valley (along the <111> direction) to enable them to move into the Γ-valley, and thus enable highly efficient direct radiative transitions, by emitting 1.55 µm wavelength (0.8 eV) photons. Therefore, a region in which light emission by avalanching takes place, that is made of germanium rather than silicon, still has an indirect bandgap, but the consequences for optoelectronic interband transitions are more complex than simply taking the physical picture of the indirect bandgap of silicon and reduce it from 1.1 eV to 0.66 eV.

For the compositions of SiGe and/or SiGeC random alloys, used with current technologies, the bandgap structure is very similar to that of silicon's, including the big difference between the indirect and smallest direct bandgaps. However, that is not the case with SiGe/Si superlattices, in which "zone folding" radically changes the band structure along the axis of growth of the superlattice, as explained by M. J. Shaw and M. Jaros: "Fundamental Physics of Strained layer GeSi: Quo Vadis", Chapter 4 of "Germanium Silicon: Physics and Materials", Vol. 56, Academic Press, 1999. The impact of strain, and the impact of the superlattice period on the band structure have been theoretically and experimentally studied for the purpose of light detection and emission. Some of the most promising superlattices seem to be $Si_5$—$Ge_5$ strained to a virtual substrate of relaxed $Si_{0.5}Ge_{0.5}$ random alloy. This particular superlattice is not suitable for monolithic integration with CMOS due to the required virtual substrate. Other superlattice designs that may result in a similar direct bandgap structure can be formed directly on the silicon substrate. One such superlattice consists of five mono-layers of $Si_{1-y}C_y$ random alloy, with a large percentage of carbon, alternating with five mono-layers of pure Ge or $Ge_{1-z}C_z$ random alloy. The amount of carbon in the $Ge_{1-z}C_z$ layer can be varied depending on the goals to be achieved. $Ge_{1-z}C_z$ alloys strained to Si have been demonstrated by M. Todd, J. Kouvetakis, D. J. Smith, "Synthesis and characterization of heteroepitaxial diamond-structured $Ge_{1-x}C_x$ (x=1.5-5.0%) alloys using chemical vapor deposition", Appl. Phys. Lett., Vol. 68, No. 17, 22 Apr. 1996, pp. 2407-2409; for much higher Carbon content, and for much thicker than the ones envisaged as required for this superlattice.

The effect of carbon on the band-structure of Germanium strained to the silicon lattice is not well characterized. What follows assumes that the addition of small amounts of carbon to a pure germanium film, will not result in qualitative changes, nor in dramatic quantitative changes to the band structure of the germanium film. It is also assumed that very small amounts of carbon can increase the critical thickness of nearly pure germanium layers strained to silicon substrates of any of the technologically relevant crystalline orientations.

Estimations indicate that the critical thickness for pure Ge on Si(100) is 1.2 nm. The incorporation of small amounts of carbon into the Ge layer can increase its critical thickness and enable the fabrication of SLs with larger number of monolayers of Ge (actually $Ge_{1-z}C_z$). Depending on the carbon content of both components of the $(Si_{1-y}C_y)_5$—$(Ge_{1-z}C_z)_5$ superlattice, it is possible for the overall layer stack to be strain compensated. It is possible to make the compressive strain in the $(Si_{1-y}C_y)_5$ layer to be even larger than the tensile strain in the $(Ge_{1-z}C_z)_5$ layer.

To have a pseudo-direct bandgap miniband, it is desirable to have a split in the conduction band of the silicon-rich layer—see for example F. Cerdeira: "Optical Properties", Chapter 5, page 231 of "Germanium Silicon: Physics and Materials", Vol. 56, Academic Press, 1999. Si tensile strained layers can be accomplished by growing silicon on a relaxed SiGe buffer layer (virtual substrate), or by including carbon in the layer: $Si_{1-y}C_y$ strained to a Si substrate, as demonstrated by K. Eberl, K. Brunner, O. G. Schmidt, "$Si_{1-y}C_y$ and $Si_{1-x-y}Ge_xC_y$ Alloy Layers" Chapter 8 of "Germanium Silicon: Physics and Materials", Vol. 56, Academic Press, 1999. See FIG. 2 (pp. 389) and 13 (pp. 403) of same book. FIGS. 16 (pp. 406) and 17 (pp. 407) show the band edge and bandgap of $Si_{1-y}C_y$ strained to Si.

In the $Si_5$—$Ge_5$ superlattice strained to a virtual substrate of relaxed $Si_{0.5}Ge_{0.5}$ random alloy, that split is induced by the tensile strain, which causes the four in-plane Δ-valleys ($Δ_∥$) to be lifted (with respect to a bulk substrate), leaving unchanged the two Δ-valleys ($Δ_⊥$) along the direction of growth of the superlattice. In the $(Si_{1-y}C_y)_5$—$(Ge_{1-z}C_z)_5$ superlattice strained to the silicon lattice, the split in the conduction band of the silicon-rich layer is induced by the compressive strain caused by the presence of carbon in that film. The compressive strain causes the two Δ-valleys ($Δ_⊥$) along the direction of growth of the superlattice to be lowered with respect to a bulk substrate and the in-plane four Δ-valleys ($Δ_∥$).

The $(Si_{1-y}C_y)_5$—$(Ge_{1-z}C_z)_5$ superlattice is likely to have a very large "oscillator strength", similar to that of $Si_5$—$Ge_5$ strained to a relaxed $Si_{0.5}Ge_{0.5}$ random alloy. The $(Si_{1-y}C_y)_5$—$(Ge_{1-z}C_z)_5$ superlattice does not have to be strain compensated, but if it were, its total thickness would not be limited by strain.

Theory predicts that the top of the valence band of the SL originates in the bulk-Ge Γ-point states. Therefore replacing pure Ge with $Ge_{1-z}C_z$ should increase the bandgap of the SL, because reduction in the strain of the Ge layer results in a smaller offset in the valence band with respect to the Si bulk. Therefore, there are good reasons to expect that a $(Ge_{1-z}C_z)_m$—$(Si_{1-y}C_y)_n$ superlattice (for example with m=n=5) strained to a silicon substrate, should result in a pseudo-direct bandgap, with a high oscillator strength. The amount of carbon in the Si-rich layer controls the conduction band edge of the SL, and the amount of carbon in the Ge-rich layer controls the valence band edge of the SL. Therefore, through the modulation of the carbon content in both layers of the SL, it is possible to perform bandgap engineering of the SL layers.

The fact that the SL conduction band edge is lower in the direction of growth than laterally may have profound consequences for electron transport: the conduction band edge (potential energy) is lower for the direction perpendicular to the substrate, than for the directions parallel to the substrate. This anisotropy is likely to have very important consequences for scattering events, such as impact ionization, in particular for the angular distribution of the velocity of the generated electron-hole pairs.

The probability of recombination across the direct bandgaps in any of these materials can be further increased by heavy n-type doping in these layers. One reason is that the lowest states in the conduction band are occupied by electrons from the heavy doping, thus pushing the Fermi-Level towards the direct badgap edge of the conduction band. This is especially relevant to indirect bandgap films/materials in which said direct bandgap is not much larger than the lowest indirect bandgap, such as germanium and superlattices containing Si, Ge, C, in which the pseudo-direct bandgap is only slightly larger than the lowest indirect bandgap.

The highest in-situ doping level possible might be achieved by incorporating impurities of several species, rather than just one as it is normally done. For example the epitaxial of Si, SiGe, SiGeC, Ge films process could have gases carrying the three commonly used n-type dopants: P, As, Sb. Very heavy doping means that there is a significant percentage of foreign atoms in the crystalline lattice. Germanium atom concentration is $4.42 \times 10^{22}$ cm$^{-3}$. A doping concentration of for example, $5 \times 10^{20}$ cm$^{-3}$ represents more than 1% of the atoms in the lattice. It should be kept in mind that in many SiGeC films, the carbon concentration is below 1%, and still there are important chemical and strain effects from carbon in those films. Another consequence of heavy doping is "Band Gap Narrowing" (BGN). This effect is detrimental for certain devices such as solar cells, but it can be an advantage for the devices of the present invention.

In conventional homojunction or heterojunction interband light emitting diodes, radiative recombination takes place in a region separating a p-type and n-type regions that act as hole and electron injectors, respectively. In homojunction devices this region is simply the depletion region. In heterojunction devices this region is chosen to have a narrower bandgap, and have a type-II alignment with respect to the p-type and n-type doped regions, thereby confining electrons and holes.

In the present invention some implementations depart from this conventional device architecture, and the region in which radiative recombination is to take place is the heavily n-type doped region.

FIGS. 5, 6, 7, and 8 show device layer profiles, in which the doping and heterojunction profiles are such that light emission through impact ionization takes place in a highly n-type doped region.

Figure 5:
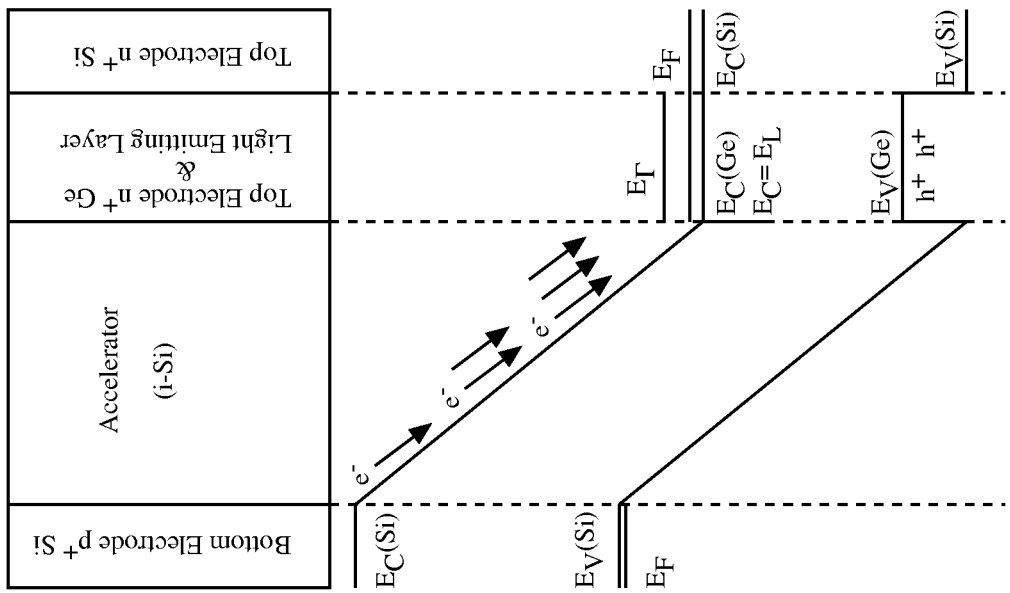
FIG. 5 shows an exemplary qualitative band diagram of a device with a p-type silicon bottom electrode, an undoped silicon "Accelerator" region, and n-type doped Ge layer, capped by a thin silicon layer, also n-type doped.

FIG. 5 shows a qualitative band diagram of a device with a p-type silicon bottom electrode, an undoped silicon "Accelerator" region, and n-type doped Ge layer, capped by a thin silicon layer, also n-type doped.

Figure 6:
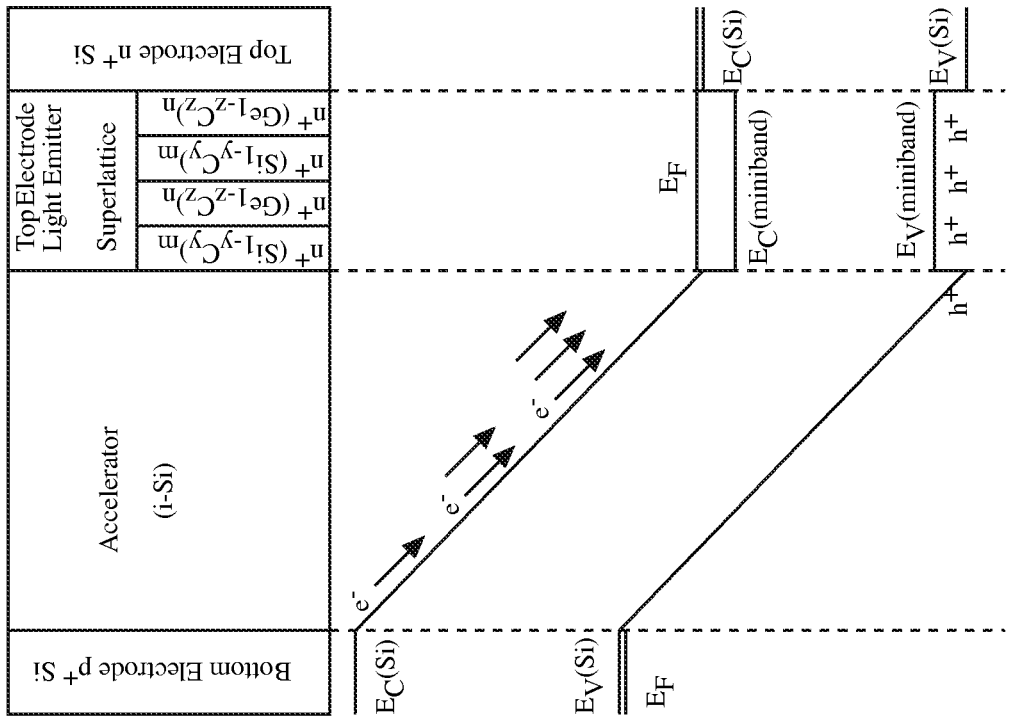
FIG. 6 shows an exemplary qualitative band diagram of a device with a p-type silicon bottom electrode, an undoped silicon "Accelerator" region, and n-type doped (SiC)—(GeC) superlattice layers, capped by a thin silicon layer, also n-type doped.

FIG. 6 shows a qualitative band diagram of a device with a p-type silicon bottom electrode, an undoped silicon "Accelerator" region, and n-type doped (SiC)—(GeC) superlattice layers, capped by a thin silicon layer, also n-type doped.

Figure 7A:
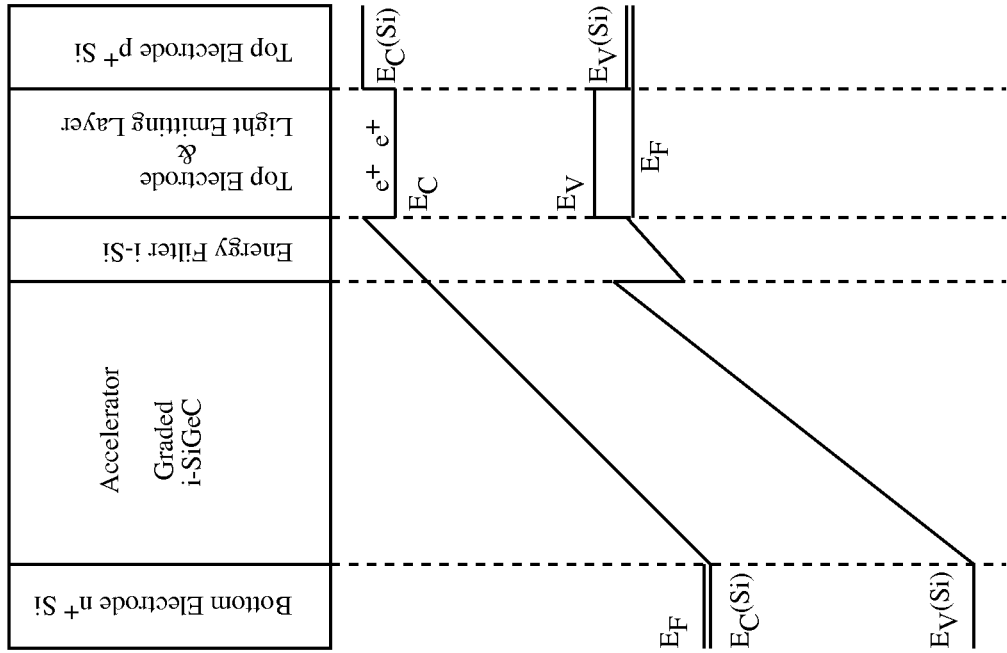
FIG. 7A shows an exemplary qualitative band diagram of a device with a p-type silicon bottom electrode, an undoped SiGe or SiGeC "Accelerator" region, and n-type doped Ge layer, capped by a thin silicon layer, also n-type doped. At the interface of the "Accelerator" region with the n-type doped light emitting layer, there is a conduction band offset. That offset can be used as an energy filter, in the sense that only carriers with kinetic energy (along the direction perpendicular to the substrate) above the barrier reach the n-type doped layer. The barrier should be thin enough so that carriers cross it without scattering, but thick enough to prevent tunneling. This barrier should prevent thermal carriers from reaching the n-type doped layer, and therefore suppresses a large portion of current that would not induce impact ionization on the n-type doped layer.
Figure 7B:
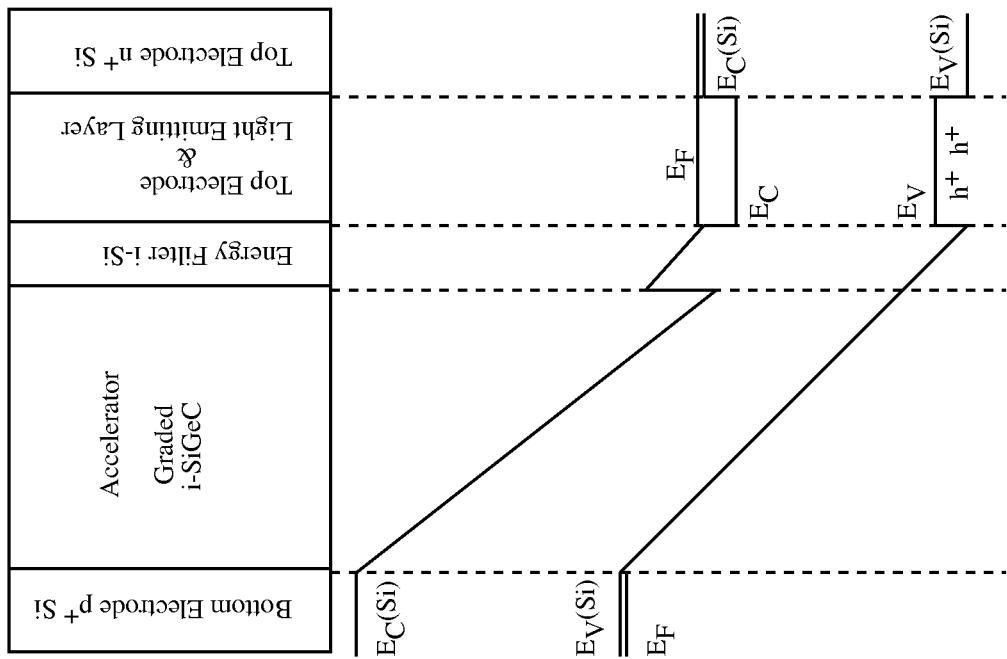
FIG. 7B shows an exemplary qualitative band diagram of a device with a n-type silicon bottom electrode, a p-type doped SiGe or SiGee "Accelerator" region, and p-type doped Ge layer, capped by a thin silicon layer, also p-type doped. At the interface of the "Accelerator" region with the p-type doped light emitting layer, there is a valence band offset. That offset can be used as an energy filter, in the sense that only carriers with kinetic energy (along the direction perpendicular to the substrate) above the barrier reach the p-type doped layer. The barrier should be thin enough so that carriers cross it without scattering, but thick enough to prevent tunneling. This barrier should prevent thermal carriers from reaching the p-type doped layer, and therefore suppresses a large portion of current that would not induce impact ionization on the p-type doped layer.

FIG. 7 shows a qualitative band diagram of a device with a p-type silicon bottom electrode, an undoped SiGe or SiGeC "Accelerator" region, and n-type doped Ge layer, capped by a thin silicon layer, also n-type doped. At the interface of the "Accelerator" region with the n-type doped light emitting layer, there is a conduction band offset. That offset can be used as an energy filter, in the sense that only carriers with kinetic energy (along the direction perpendicular to the substrate) above the barrier reach the n-type doped layer. The barrier should be thin enough so that carriers cross it without scattering, but thick enough to prevent tunneling. This barrier should prevent thermal carriers from reaching the n-type doped layer, and therefore suppresses a large portion of current that would not induce impact ionization on the n-type doped layer.

In the devices of FIGS. 5, 6, and 7, free holes are injected into the heavy n-type doped region Electron-hole pair generation by impact ionization inside the n-type region. This requires the existence of an "acceleration" region in which carriers gain energy from an electric field.

Since in silicon and germanium electron mobility is significantly higher than hole mobility, it is advantageous to design devices in which impact ionization is caused by hot electrons, rather than hot holes. Therefore, devices should be designed for light emission through avalanche of hot electrons. However in superlattice acceleration regions this may not be the case, and it may happen that it is more advantageous to have light emission from impact ionization by hot holes.

Figure 8:
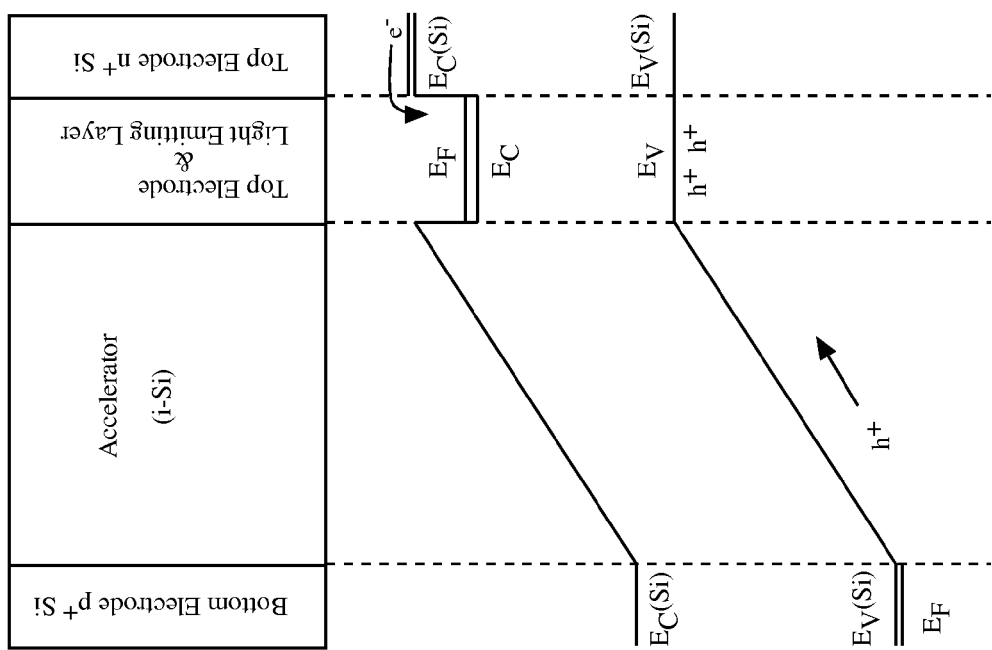
FIG. 8 shows an exemplary qualitative band diagram of a device under forward bias, rather than reverse avalanche bias. This device shows that with a conduction band barrier at the n-type doped light emitter and the middle layer (in this case not really an "accelerator"), it is possible to keep to prevent electrons to move towards the substrate, but to inject electrons to the n-type layer. The device of FIG. 9 is meant to have a direct bandgap n-type layer, because the recombinations in that layer are between thermal electrons and thermal holes.

FIG. 8 shows a qualitative band diagram of a device under forward bias, rather than reverse avalanche bias. This device shows that with a conduction band barrier at the interface between the n-type doped light emitter and the middle layer, which in this case not really an "accelerator", it is possible to prevent electrons from moving towards the substrate, but to inject electrons to the n-type layer. The device of FIG. 8 should have a direct bandgap n-type layer, because the recombinations in that layer are between thermal electrons and thermal holes.

3.2. Implementation Using Pure Ge and/or $Ge_{1-z}C$, Random Alloys on Si Substrates With very heavy n-type doping, the Fermi level may be positioned well above the lowest conduction band edge, which makes the lower energy states in the L-valley of the conduction band of germanium to be fully occupied. The deeper the Fermi level is inside the conduction band of germanium, the smaller the energy necessary to make electrons populate the bottom of the Γ-valley. With high enough n-type doping, it could be possible to position the Fermi level above the bottom of the Γ-valley. In that situation direct optoelectronic transitions across the bandgap become possible even with thermal electrons, provided that free holes are available to recombine with those electrons.

3.3. Implementation Using $(Si_{1-y}C_y)_m$—$(Ge_{1-z}C_z)_n$ Superlattices on Si Substrates Heavy n-type doping effects can also be exploited in the minibands of $(Si_{1-y}C_y)_5$—$(Ge_{1-z}C_z)_5$ superlattices, in the same way that it is for pure Ge films. If the lowest interband transition is indirect, but that a direct transition is within a very short distance (in energy), then that difference can be partially or totally bridged with heavy n-type doping, i.e., the Fermi level can be positioned very close or even above the Γ-valley of the conduction miniband, and thus the Γ-valley can be populated with thermal electrons. Radiative recombination leads to the emission of photons with energy corresponding to the difference between the top of the valence band and the Fermi level inside the conduction band. Such high concentration of impurities may result in increased band mixing and charge carrier scattering, which could be advantageous to increase the oscillator strength of direct transitions across the gap of the miniband.

3.4. Implementation Using $Si_2Sn_2C$ and/or $Ge_3SnC$ on Si Substrates

As mentioned before, these random alloys have direct bandgaps, and therefore do not require heavy n-type doping of the active region, nor avalanching to bring electrons to the Γ-valley to make efficient radiative recombinations possible. Information about these materials as provided by P. Zhang, V. H. Crespi, E. Chang, S. G. Louie, M. L. Cohen, "Theory of metastable group-IV alloys from CVD precursors", Phys. Rev. B, Vol. 64, pp. 235201, 2001; leads to the expectation that they can be incorporated into devices for light emission and light detection, including APDs and ALEDs, and that can be monolithically integrated with sub-100 nm CMOS as disclosed in the present invention. Their bandgaps are direct and small (0.625 eV for $Si_2Sn_2C$ and 0.312 eV for $Ge_3SnC$) compared to silicon, thus opening new possibilities for detection in the Mid-Wavelength Infra-Red (MWIR). It is also possible to combine these two materials into superlattices, and vary the bandgap continuously between 0.312 eV and 0.625 eV. In addition it is also possible to make superlattices of $Si_2Sn_2C$ (and/or $Ge_3SnC$) and Si, SiGe, SiGeC etc. At the moment the band structures of such materials are not known.

3.5. Implementation Using Amorphous Si, Ge, SiGe Light Emitting Layers

This approach attempts to combine the best possible aspects of the crystalline silicon for being the acceleration region, in which mobility is critical, and the avalanching layer, which does not need to have a high mobility. In fact it is useful to have a high probability of impact ionization, thus scattering, which is typical of non-single-crystal materials, and which is helped by heavy doping.

As mentioned before, the layers in which light emission through impact ionization takes place, might not be single crystalline, but rather, a thin film, for example less than 20 nm, of a-Si, or a-Ge, or a-SiGe. The amorphous layers, should be heavily doped to maximize the probability of scattering and impact ionization. Carriers accelerated in the underlying crystalline CMOS layers, will undergo impact ionization the moment they enter these heavily doped amorphous layers.

Amorphous layers are interesting because their thickness is not restricted by strain, and because amorphous layers have modified band structures with respect to the single crystalline form of the same material: for example a-Si has a direct bandgap that is slightly larger than that of c-Si.

3.6. Devices Using Non-Group IV Elements on Silicon Substrates

As mentioned earlier, there a few direct bandgap materials, that have been epitaxially grown on silicon, but that are not made of Group-IV components: $CuIn_{1-x}Ga_xS_2$ with bandgap varying linearly with Ga content from 1.5 eV (x=0) to 2.5 eV (x=1) as demonstrated by H. Metzner, J. Cieslak, J. Eberhardt, Th. Hahn, M. Müller, U. Kaiser, A. Chuvilin, U. Reis-Wollner, and W. Witthuhn, R. Goldhahn and F. Hudert, J. KräuBlich, "Epitaxial $CuIn_{1-x}Ga_xS_2$ on S(111): A perfectly lattice-matched system for x≈0.5"; Appl. Phys. Lett., Vol. 83, No. 8, 25 Aug. 2003, pp. 1563-1565., and SiCAlN with a 3.2 eV bandgap as demonstrated by John Tolle, R. Roucka, P. A. Crozier, A. V. G Chizmeshya, I. S. T. Tsong, and J. Kouvetakis, "Growth of SiCAlN on Si(111) via a crystalline oxide interface", Appl. Phys. Lett., Vol. 81, No. 12, 16 Sep. 2002, pp. 2181-2183.

GaSe, has been experimentally demonstrated by Reiner Rudolph, Christian Pettenkofer, Aaron A. Bostwick, Jonathan A. Adams, Fumio Ohuchi, Marjorie A. Olmstead, Bengt Jaeckel, Andreas Klein, and Wolfram Jaegermann, "Electronic structure of the Si(111):GaSe van der Waals-like surface termination", NewJournal of Physics 7(2005)108; to be epitaxially compatible, and having an interface with (111) silicon, in which there are no energy levels in the gap of silicon. The same has been found to be true for AlSe by J. A. Adams, A. Bostwick, T. Ohta, Fumio S. Ohuchi, and Marjorie A. Olmstead, "Heterointerface formation of aluminum selenide with silicon: Electronic and atomic structure of Si(111):AlSe", Phys. Rev. B 71, 195308 2005. Both these materials have bandgaps larger than silicon, thus allowing for the modification of the wavelength of emission.

Iron-Silicide ($\beta$-$FeSi_2$) has been identified as a direct bandgap semiconductor that can be formed on silicon, potentially compatible with CMOS, and that has a bandgap suitable for light emission and absorption of the wavelength bands relevant to fiber optics telecommunications. However until now light experimental emission from this material has not met the high expectations regarding efficiency. The attempts done so far rely on conventional designs for light emitting devices, such as those by M. Takauji, C. Li, T. Suemasu, and F. Hasegawa, "Fabrication of p-Si/$\beta$-$FeSi_2$/n-Si Double-Heterostructure Light-Emitting Diode by Molecular Beam Epitaxy", Jpn. J. Appl. Phys., Vol. 44, No. 4B, 2005, pp. 2483-2486.

The present invention enables the utilization of this material within a device design in which the light emission takes place by interband transitions induced by impact ionization inside this material. It insertion in the CMOS process flow follows the guidelines devised for SiGeC films, including the p-type doping by Boron as identified by Y. Terai, Y. Maeda, "Enhancement of 1.54 μm photoluminescence observed in Al-doped $\beta$-$FeSi_2$", Appl. Phys. Lett., Vol. 84, No. 6, 9 Feb. 2004, pp. 903-905. It can also be used with bulk, thick-film SOI, thin-film SOI, and in conjunction with "energy filtering" layers.

The design superlattices incorporating material, such as $CuIn_{1-x}Ga_xS_2$, SiCAlN, GaSe, AlSe, $\beta$-$FeSi_2$, $Si_2Sn_2C$ and $Ge_3SnC$, should allow the bandgap to be varied between 0.312 eV and 3.2 eV. With the present invention, it is possible to envision stacks of such layers for light emission and/or light absorption, each set of layers in the stack operating in a different wavelength or range of wavelengths, monolithically integrated with CMOS.

3.7. Devices Using Group IV Elements (Si, Ge, C, Sn) on Ge Substrates

This device and method of fabrication of the present invention is highly suitable to be applied to Ge substrates, such as bulk Ge and/or GOI, because of the 0.8 eV direct bandgap. One way to take advantage would be to have the avalanching region as heavily n-type doped as possible, because that would make low energy states unavailable to the hot electrons. The heavy n-type doping will fill up as many states as possible in the bottom of the conduction band of Ge or in the conduction mini band of a superlattice. Ideally all the states in the indirect band(s) would be completely filled up, so that external electric fields can inject electrons directly into the direct band(s). The heavier the doping and thus thermal electron population, the more likely it is that any hot electron relaxation is indeed across the 0.8 eV direct bandgap, rather than across the 0.66 eV indirect bandgap.

The smaller the energy difference between the Fermi-level in the indirect band and the bottom of the lowest lying direct band, the lower the energy that electrons need to gain in order to move into the direct band and thus have a very high probability of participating in radiative transitions. In this case it is possible that increasing the applied voltage, that is, increasing the maximum energy attainable by the electrons, results in an increase of the energy of the radiative transitions, thereby resulting in a "blue shift" of the photons emitted.

Additionally, using bulk Germanium or GOI substrates enables the growth epitaxial films containing Sn, and consequently enables radiative interband transitions emitting photons in the far infrared.

Due to the low processing temperature of germanium, and especially to the ease with which the surface of a germanium substrate can be cleaned and made ready for epitaxy, it is then straightforward to have more than one epitaxial growth, and it becomes possible to have multiple epitaxial devices, grown on adjacent active areas, with different materials and/or doping/heterojunction profiles, optimized for different wavelength ranges of the electrmagnetic spectrum.

3.8. Implementation with Pure Ge Device on Ge-Based Substrates

As mentioned above, a pure Ge layer with heavy n-type doping can have the Fermi level very close or above the Γ-valley. This enables radiative direct transitions through the recombination of thermal electrons and holes. If the heaviest possible n-type doping not be enough to bring the Fermi level close enough to edge of the Γ-valley, then radiative direct transitions between electrons in the Γ-valley and holes at the top of the valence band can still take place by populating the Γ-valley with hot electrons. As also mentioned earlier this is easily achieved with a device architecture in which impact ionization takes place inside the heavy n-type doped layer.

3.9. Implementation Using Group IV Elements on Ge-Based Substrates

Some GeSn alloys have been shown by M. R. Bauer, C. S. Cook, P. Aella, J. Tolle, and J. Kouvetakis, P. A. Crozier, A. V. G. Chizmeshya, and D. J. Smith, S. Zollner, "SnGe superstructure materials for Si-based infrared optoelectronics", Appl. Phys. Lett., Vol. 83, No. 17, 27 Oct. 2003, pp. 3489-3491; by H. Pérez Ladrón de Guevara, A. G. Rodríguez, H. Navarro-Contreras, and M. A. Vidal, "$Ge_{1-x}Sn_x$ alloys pseudomorphically grown on Ge(001)", Appl. Phys. Lett., Vol. 83, No. 24, 15 December 2003, pp. 4942-4944; and by G. He and H. A. Atwater, "Interband Transitions in $Sn_xGe_{1-x}$ Alloys", Phys. Rev. Lett., Vol. 79, No. 10, 8 Sep. 1997, pp. 1937-1940, have direct bandgaps; and some Ge/Sn superlattices have also been show by D. Munzar, and N. E. Christensen, "Electronic Structure of Sn/Ge superlattices", Phys. Rev. B, Vol. 49, NO. 16, 15 Apr. 1994-II, pp. 11238-11247, Table V in page 11242, have direct bandgaps. Because Sn atoms are larger than Ge, it is also conceivable that Si and C atoms may be added for partial or total strain compensation, thereby enhancing the critical thickness. The following are examples of superlattices feasible to grow on germanium substrates: $(Si_{1-y}Ge_y)_m$—$(Ge_{1-z}Sn_z)_n$; $(Si_{1-y}Sn_y)_m$—$(Ge_{1-z}Sn_z)_n$; $(Si_{1-y}C_y)_m$—$(Ge_{1-z}Sn_z)_n$; $(Si_{1-y}Ge_y)_m$—$(Sn_{1-z}C_z)_n$; and $(C_{1-y}Ge_y)_m$—$(Ge_{1-z}Sn_z)_n$.

3.10. Devices Using Non-Group IV Elements on Germanium Substrates

It has been long known that germanium is a good starting substrate for the epitaxial growth of GaAs films and devices. Naturally, the current invention can also incorporate such direct bandgap films. The films can have the conventional profiles for light emitting devices, or can also be engineered to be thin and highly doped for light emission through impact ionization in said films.

4. Application of ALEDs/Lixels

4.1. Solid-State Lighting (SSL)

ALEDs built with direct or pseudo-direct bandgap materials should have very high power efficiency, approaching that of conventional direct bandgap materials used for Solid-State Lighting. For this application, it would not be necessary to have a monolithic integration of the ALED devices with CMOS, and therefore the process flow would be much simpler and cheaper.

The advantages over conventional materials and devices for SSL would be many, starting with production costs several order of magnitude lower, especially when considering that ALEDs can be fabricated on standard 300 mm silicon substrates, with all the well established silicon process technologies and equipment, while the state of the art devices for SSL are made on 3" or 4" expensive substrates, such as sapphire.

4.2. Operation as Light Emitter or Light Absorber

The same device that has been described as a light emitter, when biased below the breakdown voltage can also be operated as an avalanche photo-detector. The exact same photonic layers (APD/ALED layers) that are part of the cells described in all Pixel/Lixel designs of a co-pending application can be operated as light sensors or light emitters. To be operated as an APD for light sensing, the voltage applied to the terminals of the APD/ALED must be below the breakdown voltage. With the appropriate circuitry at the periphery of the sensor/emitter matrix, the total current flowing through the APD can be controlled to suit different conditions of illumination. To be operated as an ALED, for light emission, the voltage applied to the terminals of the APD/ALED must be equal or above the breakdown voltage. With the appropriate circuitry at the periphery of the matrix, the total current flowing through the ALED can be controlled to prevent damage to the device. A matrix of ALEDs can have different applications.

4.3. Application of ALEDs/Lixels for Displays

If the efficiency of light emission and electrical power dissipation are appropriate, a matrix of light emitting elements (Lixels) can be scaled to make displays with an "Active Matrix" (active addressing) of "Active Pixels/Lixels", that is, a matrix in which each Pixel/Lixel emits light, and in which each pixel has its own turn on/off switch (a MOSFET device). Full color displays can be achieved by making a color filter mosaic, such as the Bayer pattern, which is identical to that used for color image sensing. The ability of making extremely small active pixels, compared to the usual Pixel/Lixel sizes of conventional flat panel displays, enables the fabrication of small displays with very high resolution, and thus very high image/video quality. The very small pixel size could be used to engineer display architectures in which a "Macro-Pixel/Lixel" for a particular primary color, is itself a matrix of many minimum-size Pixels/Lixels. This architecture makes possible to define the light intensity, and dynamic range, by the number of minimum-size Pixels/Lixels that are "ON" inside a Macro-Pixel/Lixel. For example, a Macro-Pixel/Lixel composed of a matrix of 256×256 minimum-size Pixels/Lixels can produce 256×256=65,536 levels of light intensity, which corresponds to a 16 bit dynamic range. This is a very conservative estimate because it assumes that each Pixel/Lixel can only be either "ON" or "OFF". If each Pixel/Lixel could have 4 different levels of light intensity (corresponding to 4 different applied voltages), then the dynamic range would be 18 bit. At the moment, the best dynamic range for the most common flat panel display technologies, Plasma Displays and Liquid Crystal Dsplays are in the 10 to 12 bit range.

4.4. Application of Pixels/Lixels for a Dual-Mode Sensor/Emitter Matrix

A matrix of Pixels/Lixels, for sensing/emitting light can be used in a camera for video or still photography, with the ability to alternate (through software control) image acquisition and light emission. This alternate functionality can be used for the following applications:

3D-Imaging

The measurement of the "Time-Of-Flight" (TOF) between the emission of photons and the detection of the reflected photons can be used for 3-dimensional imaging. This includes the possibility to measure multiple reflections, and thus see "behind" the objects in the filed of view. The measurement of the time of flight can be made with light emission/detection using only some or all of the primary colors. If only the IR is used, the image as seen by the human eye and recorded by typical cameras (film and digital), will not be disturbed. The fact that the light used for this purpose reaches the objects in the field of view through the lens of the camera (traveling in the opposite direction of the light that forms an image on the sensor) may have benefits in terms of power needed as well as better control of secondary reflections. This can be especially useful when using tele-photo lens to capture 3D images of very far away objects.

ALEDs/Lixels as a Fully Integrated Flash

In this case the light of the flash travels through the lenses of the camera, and illuminates directly only what is in the field of view of the lenses, regardless of their type (wide angle, macro, telephoto, etc.). In turn this should decrease the optical power requirements, compared to a conventional flash, which emits light isotropically. It is possible to control the color(s) and color temperature of the flash, by controlling the light intensity that goes through each type of primary color filter (R, G, B, IR). This is radically different from conventional flashes for cameras.

Monolithically Integrated Optoelectronic Transceiver

With appropriate the material/composition for the epitaxially deposited light emitting film, it is possible to have light absorption & emission in the infrared, namely in the 1.3 µm to 1.55 µm range, which are the wavelengths used in fiber optics communications. Therefore, it becomes possible to fabricate CMOS integrated circuits that can directly receive light signals from, and emit light signals to, optical fibers, thereby enabling low cost technology alternative to solutions based on III/V compound semiconductors.

In the present disclosure, several materials have been mentioned as good candidates to cover these wavelength ranges: $(Ge_{1-z}C_z)_5$—$(Si_{1-y}C_y)_5$, $\beta$-$FeSi_2$, $Si_2Sn_2C$, and $Ge_3SnC$.

The invention claimed is:

1. A photonic device capable of light absorption and/or light emission, monolithically integrated with CMOS, including sub-100 nm CMOS, with epitaxially grown photonic active layers comprising a charge carrier acceleration region, interfacing a layer for filtering the momentum and energy of charge carriers, which on its opposite side interfaces a light emission and absorption layer, wherein light emission or absorption is controlled by a voltage applied to deposited films on a pre-defined CMOS active area of a substrate selected from the group consisting of bulk Si, bulk Ge, Thick-Film Silicon-On-Insulator SOI, Thin-Film Silicon-On-Insulator SOI, and Thin-Film Germanium-On-Insulator GOI.

2. A photonic device according to claim 1, made on a silicon substrate, wherein the photonic active layers comprise a pseudomorphic pseudo-direct bandgap material, selected from the group consisting of mono-layer superlattices comprising layers of Si, Ge, $Si_{1-x}Ge_x$, $Si_{1-y}C_y$, $Si_{1-z}Sn_z$, $Ge_{1-y}C_y$, $Ge_{1-z}Sn_z$, $Ge_{1-y-z}C_ySn_z$, $Si_{1-x-y}Ge_xC_y$, $Si_{1-x-y-z}Ge_xC_ySn_z$, or pseudomorphic direct bandgap material, selected from the group consisting of $Si_2Sn_2C$ and $Ge_3SnC$.

3. A photonic device according to claim 2, being part of a diode whose performance and functionality depends on the bias applied to said diode, and which said bias can be divided into five main regions of operation, wherein:
   under zero voltage it operates in a conventional photovoltaic mode;
   under a reverse bias voltage that is near the breakdown point under illumination, it operates as an avalanche photo-diode;
   under a reverse bias voltage that is between the breakdown point under illumination and the breakdown point without illumination, it operates as a Geiger-mode avalanche photo-diode;
   under a reverse bias voltage that is above the breakdown point without illumination, it emits light with a broad wavelength spectrum from said light emission and absorption layer, through the recombination of carriers in said light emission and absorption layer, said carriers having been generated by an avalanche process through impact ionization of other carriers whose energy was increased while traversing said charge carrier acceleration region;
   under a forward bias voltage it emits light through the recombination of thermal carriers inside said light emission and absorption layer.

4. A photonic device according to claim 1, made on a silicon substrate, wherein said photonic device comprises materials listed in claim 9, or a material selected from the group consisting of $CuIn_{1-x}Ga_xSi_2$ and SiCAlN.

5. A photonic device according to claim 4, being part of a diode whose performance and functionality depends on the bias applied to said diode, and which said bias can be divided into five main regions of operation, wherein:
   under zero voltage it operates in a conventional photovoltaic mode;
   under a reverse bias voltage that is near the breakdown point under illumination, it operates as an avalanche photo-diode;
   under a reverse bias voltage that is between the breakdown point under illumination and the breakdown point without illumination, it operates as a Geiger-mode avalanche photo-diode;
   under a reverse bias voltage that is above the breakdown point without illumination, it emits light with a broad wavelength spectrum from said light emission and absorption layer, through the recombination of carriers in said light emission and absorption layer, said carriers having been generated by an avalanche process through impact ionization of other carriers whose energy was increased while traversing said charge carrier acceleration region;
   under a forward bias voltage it emits light through the recombination of thermal carriers inside said light emission and absorption layer.

6. A photonic device according to claim 1, fabricated on Thin-Film Silicon-On-Insulator (SOI) or Thin-Film Germanium-On-Insulator (GOI), embedded in an optical vertical cavity, in which light emission and/or absorption takes place from front-side only, or from the back-side only, or from both the front-side and back-side.

7. Layout cell, suitable for replication to form matrices, incorporating at least one MOSFET and the photonic device of claim 1, wherein:
   the top electrode of each photonic device, comprising the photonic active layers, is interconnected in a column-parallel, row-parallel, or matrix-parallel fashion;
   the bottom electrode of each photonic device comprises a photonic active layer and a source/drain region of said MOSFET having the same doping polarity; and
   the electrical contact to the bottom electrode of each photonic device, comprising the photonic active layer, is made by electrically connecting the active area underneath the bottom of the photonic active layers with a source/drain region of said MOSFET.

8. The exemplary heterojunction and doping profiles implemented in the epitaxial layers of claim 1 or claim 7, wherein the bottom electrode is a p-type region of the substrate, on top of which are epitaxially grown the following layers:
   (a) lowly doped or undoped charge carrier acceleration layer with a graded bandgap, becoming progressively narrower near the top, in which most of the bandgap reduction takes place in the conduction band,
   (b) lowly doped or undoped momentum and energy filtering layer with a wider bandgap, providing a conduction band barrier with respect to the acceleration region,
   (c) a highly n-type doped light absorbing/emitting layer with a bandgap narrower than that of the filtering layer, and in which the band offsets are approximately symmetric for the valence and conduction bands,
   (d) a highly n-type doped capping layer, with a bandgap wider than that of the light absorbing/emitting layer, providing conduction and valence band barriers.

9. The exemplary heterojunction and doping profiles implemented in the epitaxial layers of claim 1 or claim 7, wherein the bottom electrode is a n-type region of the substrate, on top of which are epitaxially grown the following layers:
  (a) lowly doped or undoped charge carrier acceleration layer with a graded bandgap, becoming progressively narrower near the top, in which most of the bandgap reduction takes place in the valence band,
  (b) lowly doped or undoped momentum and energy filtering layer with a wider bandgap, providing a valence band barrier with respect to the acceleration region,
  (c) a highly p-type doped light absorbing/emitting layer with a bandgap narrower than that of the filtering layer, and in which the band offsets are approximately symmetric for the valence and conduction bands,
  (d) a highly p-type doped capping layer, with a bandgap wider than that of the light absorbing/emitting layer, providing conduction and valence band barriers.

10. The exemplary heterojunction and doping profiles, of a first and second polarity, implemented in the epitaxial layers of claim 1 or claim 7, wherein the bottom electrode is a region of the substrate doped with dopants of the first polarity, on top of which are epitaxially grown the following layers:
  (a) lowly doped or undoped charge carrier acceleration layer with a graded bandgap, becoming progressively narrower near the top, in which most of the bandgap reduction takes place in the energy band populated by charge carriers of the second polarity,
  (b) lowly doped or undoped momentum and energy filtering layer with a wider bandgap, providing a energy band barrier for charge carriers of the second polarity, with respect to the acceleration region,
  (c) a highly doped light absorbing/emitting layer, with dopants of the second polarity, with a bandgap narrower than that of the filtering layer, and in which the band offsets are approximately symmetric for the energy bands for carriers of each polarity,
  (d) a capping layer, highly doped with dopants of the second polarity, with a bandgap wider than that of the light absorbing/emitting layer, providing conduction and valence band barriers.

\* \* \* \* \*